US012743019B2

(12) United States Patent
Hirohara et al.

(10) Patent No.: US 12,743,019 B2
(45) Date of Patent: Sep. 22, 2026

(54) RESIST UNDERLAYER FILM-FORMING COMPOSITION CONTAINING TERMINAL-BLOCKED REACTION PRODUCT

(71) Applicant: NISSAN CHEMICAL CORPORATION, Tokyo (JP)

(72) Inventors: Tomotada Hirohara, Toyama (JP); Shou Shimizu, Toyama (JP); Mamoru Tamura, Toyama (JP)

(73) Assignee: NISSAN CHEMICAL CORPORATION, Tokyo (JP)

( * ) Notice: Subject to any disclaimer, the term of this patent is extended or adjusted under 35 U.S.C. 154(b) by 689 days.

(21) Appl. No.: 18/026,396

(22) PCT Filed: Sep. 30, 2021

(86) PCT No.: PCT/JP2021/036052

§ 371 (c)(1),
(2) Date: Mar. 15, 2023

(87) PCT Pub. No.: WO2022/071468

PCT Pub. Date: Apr. 7, 2022

(65) Prior Publication Data

US 2023/0341777 A1 Oct. 26, 2023

(30) Foreign Application Priority Data

Oct. 1, 2020 (JP) ................................ 2020-166828

(51) Int. Cl.

| | |
|---|---|
| ***G03F 7/11*** | (2006.01) |
| ***C08G 59/14*** | (2006.01) |
| ***C08G 65/329*** | (2006.01) |
| ***C09D 171/00*** | (2006.01) |
| ***G03F 7/16*** | (2006.01) |
| ***H10P 76/20*** | (2026.01) |

(52) U.S. Cl.

CPC ............ *G03F 7/11* (2013.01); *C08G 59/1483* (2013.01); *C08G 65/329* (2013.01); *C09D 171/00* (2013.01); *H10P 76/2041* (2026.01); *G03F 7/168* (2013.01)

(58) Field of Classification Search

CPC ..... G03F 7/11; C08G 59/1483; C08G 65/329; C09D 171/00; H01L 21/0274; H10P 76/2041

See application file for complete search history.

(56) References Cited

U.S. PATENT DOCUMENTS

| | | | | |
|---|---|---|---|---|
| 2013/0171569 A1* | 7/2013 | Tachibana | G03F 7/0752 | 430/287.1 |
| 2013/0230809 A1* | 9/2013 | Sakamoto | G03F 7/00 | 430/324 |
| 2015/0031206 A1 | 1/2015 | Endo et al. | | |
| 2015/0087155 A1* | 3/2015 | Endo | C09D 175/12 | 524/317 |
| 2015/0362838 A1 | 12/2015 | Endo et al. | | |
| 2016/0139509 A1* | 5/2016 | Hashimoto | G03F 7/11 | 568/660 |
| 2017/0045820 A1* | 2/2017 | Sakaida | C08G 73/0655 | |

FOREIGN PATENT DOCUMENTS

| | | |
|---|---|---|
| CN | 103221888 A | 7/2013 |
| CN | 104303107 A | 1/2015 |
| CN | 106233207 A | 12/2016 |
| JP | 2009-93162 A | 4/2009 |
| TW | 201351049 A | 12/2013 |
| TW | 201605966 A | 2/2016 |
| WO | 2013/088931 A1 | 6/2013 |
| WO | 2013/133088 A1 | 9/2013 |
| WO | 2013/141015 A1 | 9/2013 |
| WO | 2013/168610 A1 | 11/2013 |

OTHER PUBLICATIONS

Jan. 23, 2025 Office Action issued in Chinese Patent Application No. 202180067677.5.

Mar. 28, 2023 International Preliminary Report on Patentability issued in International Patent Application No. PCT/ JP2021/ 036052.

Dec. 24, 2024 Office Action issued in Taiwanese Patent Application No. 110136404.

Dec. 21, 2021 International Search Report issued in International Patent Application No. PCT/JP2021/036052.

* cited by examiner

*Primary Examiner* — Keith Walker
*Assistant Examiner* — Alexander N. Lee
(74) *Attorney, Agent, or Firm* — Oliff PLC

(57) ABSTRACT

A composition for forming a resist underlayer film and a method for producing a resist pattern, the method using the composition for forming a resist underlayer film; and a method for producing a semiconductor device. A resist underlayer film-forming composition which contains an organic solvent and a polymer that has an end blocked with a compound (A), wherein: the polymer is derived from compound (B) that is represented by formula (11). (In formula (11), Y1 represents a single bond, an oxygen atom, a sulfur atom, an alkylene group having from 1 to 10 carbon atoms, the alkylene group being optionally substituted by a halogen atom or an aryl group having from 6 to 40 carbon atoms, or a sulfonyl group; each of T1 and T2 represents an alkyl group having from 1 to 10 carbon atoms; and each of n1 and n2 independently represents an integer from 0 to 4).

7 Claims, No Drawings

RESIST UNDERLAYER FILM-FORMING COMPOSITION CONTAINING TERMINAL-BLOCKED REACTION PRODUCT

TECHNICAL FIELD

The present invention relates to a composition for use in a lithography process in manufacturing a semiconductor, in particular, in the state-of-the-art (ArF, EUV, EB, or the like) lithography process. In addition, the present invention relates to a method for manufacturing a substrate with a resist pattern by applying a resist underlayer film, and a method for manufacturing a semiconductor device.

BACKGROUND ART

Conventionally, in manufacturing of a semiconductor device, fine processing by lithography using a resist composition has been performed. The fine processing is a processing method for forming a thin film of a photoresist composition on a semiconductor substrate such as a silicon wafer, irradiating the thin film with active rays such as ultraviolet rays through a mask pattern in which a pattern of a device is formed, developing the thin film, and etching the substrate using the obtained photoresist pattern as a protective film, thereby forming fine unevenness corresponding to the pattern on a surface of the substrate. In recent years, the degree of integration of a semiconductor device has been increased, and in addition to an i-line (wavelength: 365 nm), a KrF excimer laser (wavelength: 248 nm), and an ArF excimer laser (wavelength: 193 nm) that have been used in the related art, active rays used for practical application of an extreme ultraviolet ray (EUV, wavelength: 13.5 nm) or an electron beam (EB) have been studied for the state-of-the-art fine processing. Accordingly, the influence of the semiconductor substrate on the resist has become a major problem.

Therefore, in order to solve this problem, a method for providing an anti-reflective film (bottom anti-reflective coating (BARC)) or a resist underlayer film between the resist and the semiconductor substrate has been widely studied. Patent Literature 1 discloses a resist underlayer film-forming composition used in a lithography process for manufacturing a semiconductor device containing a polymer containing a repeating unit structure having a polycyclic aliphatic ring in a main chain of the polymer. Patent Literature 2 discloses a resist underlayer film-forming composition for lithography containing a polymer having a specific structure at a terminal thereof.

CITATION LIST

Patent Literature

Patent Literature 1: SP 2009-093162 A
Patent Literature 2: WO 2013/141015 A

SUMMARY OF INVENTION

Technical Problem

The properties required for resist underlayer films include, for example, that intermixing with a resist film formed on an upper layer does not occur (that is insoluble in a resist solvent), and that a dry etching rate is higher than that of the resist film.

In the case of lithography with EUV exposure, a line width of a resist pattern to be formed is 32 nm or less, and a resist underlayer film for EUV exposure is formed to be thinner than that in the related art. When such a thin film is formed, pinholes, agglomeration, and the like are likely to occur due to the influence of the surface of the substrate, the polymer to be used, and the like, and it was difficult to form a uniform film without defects.

On the other hand, when a resist pattern is formed, a method in which an unexposed portion of a resist film is removed using a solvent capable of dissolving the resist film, and usually an organic solvent; and an exposed portion of the resist film is left behind in a development process, may be adopted. In such a negative development process, improvement of adhesion of the resist pattern has become a major problem.

In addition, it has been required to suppress deterioration of Line Width Roughness ((LWR), fluctuation in line width (roughness)) at the time of forming a resist pattern, to form a resist pattern having a desirable rectangular shape, and to improve resist sensitivity.

An object of the present invention is to provide a composition for forming a resist underlayer film and a resist pattern forming method using the resist underlayer film-forming composition, which have solved the above problems and enable the formation of a desired resist pattern.

Solution to Problem

The present invention encompasses the followings.

[1] A resist underlayer film-forming composition containing:

a polymer having a terminal blocked with a compound (A); and an organic solvent, in which the polymer is a polymer derived from a compound (B represented by the following Formula (11):

[Chem. 1]

Formula (11)

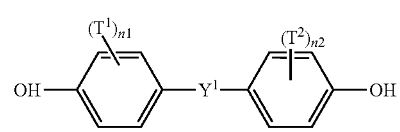

(in Formula (11), $Y^1$ represents a single bond, an oxygen atom, a sulfur atom, an alkylene group having 1 to 10 carbon atoms which may be substituted with a halogen atom or an aryl group having 6 to 40 carbon atoms, or a sulfonyl group, each of $T^1$ and $T^2$ represents an alkyl group having 1 to 10 carbon atoms, and n1 and n2 each independently represent an integer of 0 to 4).

Preferably, in the resist underlayer film-forming composition containing the polymer having the terminal blocked with the compound (A); and the organic solvent, the polymer has a repeating unit structure derived from the compound (B) represented by Formula (11).

[2] The resist underlayer film-forming composition according to [1], in which the compound (A) contains an aliphatic ring which may be substituted with a substituent.

[3] The resist underlayer film-forming composition according to [2], in which the aliphatic ring is a monocyclic or polycyclic aliphatic ring having 3 to 10 carbon atoms.

[4] The resist underlayer film-forming composition according to [2], in which the aliphatic ring is a bicyclo ring or a tricyclo ring.

[5] The resist underlayer film-forming composition according to any one of [2] to [4], in which the substituent is selected from a hydroxy group, a linear or branched alkyl group having 1 to 10 carbon atoms, an alkoxy group having 1 to 20 carbon atoms, an acyloxy group having 1 to 10 carbon atoms which may be interrupted by an oxygen atom, and a carboxy group.

[6] The resist underlayer film-forming composition according to [1], in which the compound (A) is represented by the following Formula (1) or Formula (2):

[Chem. 2]

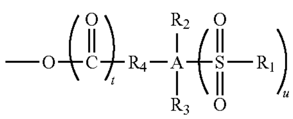

(1)

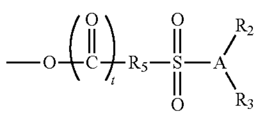

(2)

(in Formula (1) and Formula (2), $R_1$ represents an alkyl group having 1 to 6 carbon atoms which may have a substituent, a phenyl group, a pyridyl group, a halogeno group, or a hydroxy group; $R_2$ represents a hydrogen atom, an alkyl group having 1 to 6 carbon atoms, a hydroxy group, a halogeno group, or an ester group represented by —C(═O)O—X, X represents an alkyl group having 1 to 6 carbon atoms which may have a substituent; represents a hydrogen atom, an alkyl group having 1 to 6 carbon atoms, a hydroxy, group, or a halogeno group; $R_4$ represents a direct bond or a divalent organic group having 1 to 8 carbon atoms; $R_5$ represents a divalent organic group having 1 to 8 carbon atoms; A represents an aromatic ring or an aromatic heterocyclic ring; t represents 0 or 1; and u represents 1 or 2).

[7] The resist underlayer film-forming composition according to any one of [1] to [6], in which the polymer has a repeating unit structure derived from the compound (B) and a compound (C) capable of reacting with the compound (B), and the compound (C) has a heterocyclic structure.

Preferably, in the resist underlayer film-forming composition according to any one of [1] to [6], the polymer has a repeating unit structure derived from the compound (B) and a compound (C) capable of reacting with the compound (B), and the compound (C) has a heterocyclic structure.

[8] The resist underlayer film-forming composition according to any one of [1] to [7], in which $Y^1$ is a sulfonyl group.

[9] The resist underlayer film-forming composition according to any one of [1] to [8], further containing an acid generator.

[10] The resist underlayer film-forming composition according to any one of [1] to [9], further containing a crosslinking agent.

[11] A resist underlayer film which is a baked product of a coating film of the resist underlayer film-forming composition according to any one of [1] to [10].

[12] A method for manufacturing a patterned substrate, comprising the steps of:

applying the resist underlayer film-forming, composition according to any one of [1] to [10] onto a semiconductor substrate and baking the resist underlayer film-forming composition to form a resist underlayer film;

applying a resist onto the resist underlayer film and baking the resist to form a resist film;

exposing the resist underlayer film and the semiconductor substrate coated with the resist; and developing the exposed resist film to perform patterning.

[13] A method for manufacturing a semiconductor device, comprising the steps of:

forming a resist underlayer film of the resist underlayer film-forming composition according to any one of [1] to [10] on a semiconductor substrate;

forming a resist film on the resist underlayer film;

forming a resist pattern by irradiating the resist film with a light or electron beam and then developing the irradiated resist film;

forming a patterned resist underlayer film by etching the resist underlayer film through the formed resist pattern; and processing the semiconductor substrate by the patterned resist underlayer film.

Advantageous Effects of Invention

The resist underlayer film formed of the resist underlayer film-forming composition containing a polymer having a terminal blocked with a compound can exhibit excellent resistance to an organic solvent used in the photoresist formed on an upper portion of the underlayer film, and can form a resist underlayer film exhibiting desirable film thickness uniformity even in an extremely thin film (film thickness of 10 nm or less). In addition, in a case where a resist pattern is formed using the resist underlayer film-forming composition of the present invention, a limit resolution size at which no resist pattern collapse after development is observed is smaller than that of a conventional resist underlayer film, thereby a finer resist pattern can be formed. In addition, there is also an advantageous effect that a range of the resist pattern size indicating a desirable pattern is increased as compared with the prior att.

DESCRIPTION OF EMBODIMENTS

<Resist Underlayer Film-Forming Composition>

A resist underlayer film-forming composition of the present invention contains a polymer having a terminal blocked with a compound (A) and an organic solvent, <Polymer>

The polymer of the present invention is a polymer derived from a compound (B) represented by the following Formula (11):

[Chem. 3]

Formula (11)

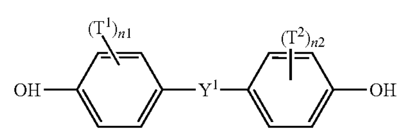

(in Formula (11), $Y^1$ represents a single bond, an oxygen atom, a sulfur atom, an alkylene group having 1 to 10 carbon atoms which may be substituted with a halogen atom or an aryl group having 6 to 40 carbon atoms, or a sulfonyl group, each of $T^1$ and $T^2$ represents an alkyl group having 1 to 10 carbon atoms, and n1 and n2 each independently represent an integer of 0 to 4).

Preferably, it contains a reaction product of the compound (B) and a compound (C) capable of reacting with the compound (B) as a repeating unit structure.

$Y^1$ is preferably a sulfonyl group.

Examples of the aryl group having 6 to 40 carbon atoms include a phenyl group, an o-methylphenyl group, an m-methylphenyl group, a p-methylphenyl group, an o-chlorophenyl group, an m-chlorophenyl group, a p-chlorophenyl group, an o-fluorophenyl group, a p-fluorophenyl group, an o-methoxyphenyl group, a p-methoxyphenyl group, a p-nitrophenyl group, a p-cyanophenyl group, an α-naphthyl group, a β-naphthyl group, an o-biphenylyl group, an m-biphenylyl group, a p-biphenylyl group, a 1-anthryl group, a 2-anthryl group, a 9-anthryl group, a 1-phenanthryl group, a 2-phenanthryl group, a 3-phenanthryl group, a 4-phenanthryl group, and a 9-phenanthryl group.

Examples of the alkylene group having 1 to 10 carbon atoms include a methylene group, an ethylene group, an n-propylene group, an isopropylene group, a cyclopropylene group, an n-butylene group, an isobutylene group, an s-butylene group, a t-butylene group, a cyclobutylene group, a 1-methyl-cyclopropylene group, a 2-methyl-cyclopropylene group, an n-pentylene group, a 1-methyl-n-butylene group, a 2-methyl-n-butylene group, a 3-methyl-n-butylene group, a 1,1-dimethyl-n-propylene group, a 1,2-dimethyl-n-propylene group, a 2,2-dimethyl-n-propylene group, a 1-ethyl-n-propylene group, a cyclopentylene group, a 1-methyl-cyclobutylene group, a 2-methyl-cyclobutylene group, a 3-methyl-cyclobutylene group, a 1,2-dimethyl-cyclopropylene group, a 2,3-dimethyl-cyclopropylene group, a 1-ethyl-cyclopropylene group, a 2-ethyl-cyclopropylene group, an n-hexylene group, a 1-methyl-n-pentylene group, a 2-methyl-n-pentylene group, a 3-methyl-n-pentylene group, a 4-methyl-n-pentylene group, a 1,1-dimethyl-n-butylene group, a 1,2-dimethyl-n-butylene group, a 1,3-dimethyl-n-butylene group, a 2,2-dimethyl-n-butylene group, a 2,3-dimethyl-n-butylene group, a 3,3-dimethyl-n-butylene group, a 1-ethyl-n-butylene group, a 2-ethyl-n-butylene group, a 1,1,2-trimethyl-n-propylene group, a 1,2,2-trimethyl-n-propylene group, a 1-ethyl-1-methyl-n-propylene group, a 1-ethyl-2-methyl-n-propylene group, a cyclohexylene group, a 1-methyl-cyclopentylene group, a 2-methyl-cyclopentylene group, a 3-methyl-cyclopentylene group, a 1-ethyl-cyclobutylene group, a 2-ethyl-cyclobutylene group, a 3-ethyl-cyclobutylene group, a 1,2-dimethyl-cyclobutylene group, a 1,3-dimethyl-cyclobutylene group, a 2,2-dimethyl-cyclobutylene group, a 2,3-dimethyl-cyclobutylene group, a 2,4-dimethyl-cyclobutylene group, a 3,3-dimethyl-cyclobutylene group, a 1-n-propyl-cyclopropylene group, a 2-n-propyl-cyclopropylene group, a 1-isopropyl-cyclopropylene group, a 2-isopropyl-cyclopropylene group, a 1,2,2-trimethyl-cyclopropylene group, a 1,2,3-trimethyl-cyclopropylene group, a 2,2,3-trimethyl-cyclopropylene group a 1-ethyl-2-methyl-cyclopropylene group, a 2-ethyl-1-methyl-cyclopropylene group, a 2-ethyl-2-methyl-cyclopropylene group, a. 2-ethyl-3-methyl-cyclopropylene group, an n-heptylene group, an n-octylene group, an n-nonylene group, and an n-decanylene group.

Examples of the alkyl group having 1 to 10 carbon atoms include a methyl group, an ethyl group, an n-propyl group, an i-propyl group, a cyclopropyl group, an n-butyl group, an i-butyl group, an s-butyl group, a t-butyl group, a cyclobutyl group, a 1-methyl-cyclopropyl group, a 2-methyl-cyclopropyl group, an n-pentyl group, a 1-methyl-n-butyl group, a 2-methyl-n-butyl group, a 3-methyl-n-butyl group, a 1,1-dimethyl-n-propyl group, a 1,2-dimethyl-n-propyl group, a 2,2-dimethyl-n-propyl group, a 1-ethyl-n-propyl group, a cyclopentyl group, a 1-methyl-cyclobutyl group, a 2-methyl-cyclobutyl group, a 3-methyl-cyclobutyl group, a 1,2-dimethyl-cyclopropyl group, a 2,3-dimethyl-cyclopropyl group, a 1-ethyl-cyclopropyl group, a 2-ethyl-cyclopropyl group, an n-hexyl group, a 1-methyl-n-pentyl group, a 2-methyl-n-pentyl group, a 3-methyl-n-pentyl group, a 4-methyl-n-pentyl group, a 1,1-dimethyl-n-butyl group, a 1,2-dimethyl-n-butyl group, a 1,3-dimethyl-n-butyl group, a 2,2-dimethyl-n-butyl group, a 2,3-dimethyl-n-butyl group, a 3,3-dimethyl-n-butyl group, a 1-ethyl-n-butyl group, a 2-ethyl-n-butyl group, a 1,1,2-trimethyl-n-propyl group, a 1,2,2-trimethyl-n-propyl group, a 1-ethyl-1-methyl-n-propyl group, a 1-ethyl-2-methyl-n-propyl group, a cyclohexyl group, a 1-methyl-cyclopentyl group, a 2-methyl-cyclopentyl group, a 3-methyl-cyclopentyl group, a 1-ethyl-cyclobutyl group, a 2-ethyl-cyclobutyl group, a 3-ethyl-cyclobutyl group, a 1,2-dimethyl-cyclobutyl group, a 1,3-dimethyl-cyclobutyl group, a 2,2-dimethyl-cyclobutyl group, a 2,3-dimethyl-cyclobutyl group, a 2,4-dimethyl-cyclobutyl group, a 3,3-dimethyl-cyclobutyl group, a 1-n-propyl-cyclopropyl group, a 2-n-propyl-cyclopropyl group, a 1-i-propyl-cyclopropyl group, a 2-i-propyl-cyclopropyl group, a 1,2,2-trimethyl-cyclopropyl group, a 1,2,3-trimethyl-cyclopropyl group, a 2,2,3-trimethyl-cyclopropyl group, a 1-ethyl-2-methyl-cyclopropyl group, a 2-ethyl-1-methyl-cyclopropyl group, a 2-ethyl-2-methyl-cyclopropyl group, a 2-ethyl-3-methyl-cyclopropyl group, and a decyl group. Of these, an alkyl group having 1 to 4 carbon atoms is preferable; it is preferable that the alkyl group is selected from a methyl group, an ethyl group, an n-propyl group, an i-propyl group, an n-butyl group, an i-butyl group, an s-butyl group, and a t-butyl group; and a methyl group or an ethyl group is preferable.

The polymer preferably has a heterocyclic structure. That is, a reactive compound (C) described below preferably has a heterocyclic structure.

Examples of the heterocyclic structure include furan, thiophene, pyrrole, imidazole, pyran, pyridine, pyrimidine, pyrazine, pyrrolidine, piperidine, piperazine, morpholine, indole, purine, quinoline, isoquinoline, quinuclidine, chromene, thianthrene, phenothiazine, phenoxazine, xanthene, acridine, phenazine, carbazole, triazinone, triazinedione, triazinetrione, and heterocyclic structures shown in (10-h) to (10-k) listed as specific examples of the compound (C). Of these, triazinetrione or a heterocyclic structure shown in the following Formula (10-k) is preferable.

<Compound (C) Capable of Reacting with Compound (B)>

The reactive compound (C) is not particularly limited as long as it is a compound (C) having a substituent capable of reacting with a hydroxy group of the compound (B), but is preferably a compound containing two epoxy groups. Specific examples of the reactive compound (C) include compounds shown below.

[Chem. 4]

(10-a)

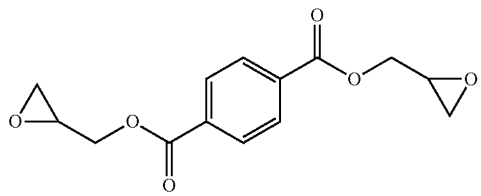

(10-b)

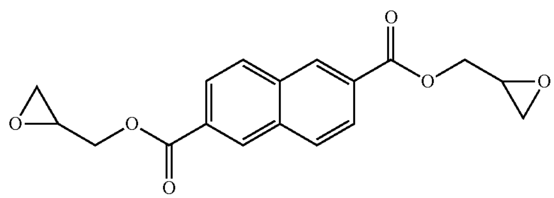

(10-c)

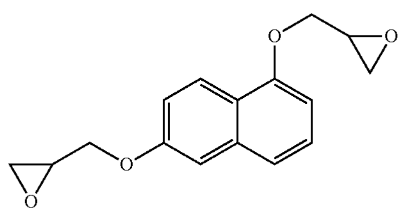

(10-d)

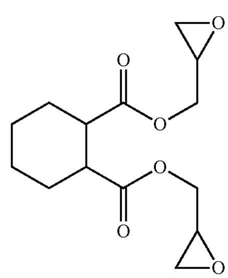

(10-e)

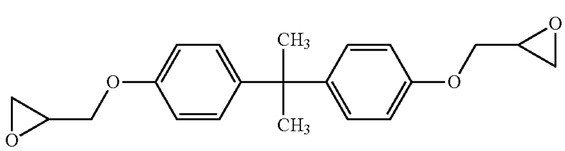

(10-f)

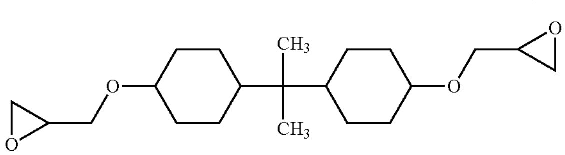

(10-g)

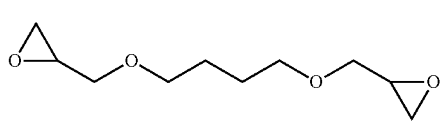

-continued (10-h)

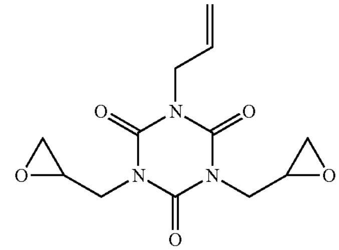

(10-i)

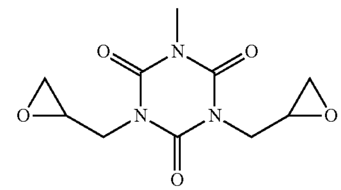

(10-j)

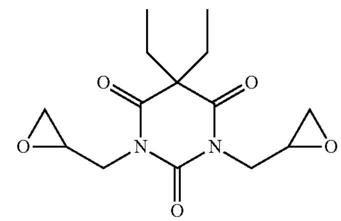

(10-k)

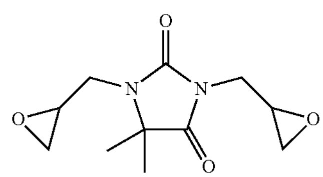

The weight average molecular weight of the polymer is preferably within the range of 500 to 50,000 and more preferably 1,000 to 30,000. The weight average molecular weight can be determined by, for example, gel permeation chromatography described in Examples.

The ratio of the polymer contained in the entire resist underlayer film-forming composition of the present invention is usually within the range of 0.05% by mass to 3.0% by mass, 0.08% by mass to 2.0% by mass, or 0.1% by mass to 1.0% by mass.

Examples of the organic solvent contained in the resist underlayer film-forming composition of the present invention include ethylene glycol monomethyl ether, ethylene glycol monoethyl ether, methyl cellosolve acetate, ethyl cellosolve acetate, diethylene glycol monomethyl ether, diethylene glycol monoethyl ether, propylene glycol, propylene glycol monomethyl ether, propylene glycol monoethyl ether, propylene glycol monomethyl ether acetate, propylene glycol propyl ether acetate, toluene, xylene, methyl ethyl ketone, methyl isobutyl ketone, cyclopentanone, cyclohexanone, cycloheptanone, 4-methyl-2-pentanol, methyl 2-hydroxyisobutyrate, ethyl 2-hydroxyisobutyrate, ethyl ethoxy acetate, 2-hydroxyethyl acetate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, butyl lactate, 2-heptanone, methoxycyclopentane, anisole, γ-butyrolactone, N-methylpyrrolidone, N,N-dimethylformamide, and N,N-dimethylacetamide. These solvents may be used each alone or in combination of two or more thereof.

Of these solvents, propylene glycol monomethyl ether, propylene glycol monomethyl ether acetate, ethyl lactate, butyl lactate, and cyclohexanone are preferable. In particular, propylene glycol monomethyl ether and propylene glycol monomethyl ether acetate are preferable.

<Compound (A) [1]>

It is preferable that the compound (A) contains an aliphatic ring which may be substituted with a substituent.

The aliphatic ring is preferably a monocyclic or polycyclic aliphatic ring having 3 to 10 carbon atoms. Examples of the monocyclic or polycyclic aliphatic ring having 3 to 10 carbon atoms include cyclopropane, cyclobutane, cyclopentane, cyclohexane, cyclohexane, cycioheptane, cyclooctane, cyclononane, cyclodecane, spirobicyclopentane, bicyclo[2.1.0]pentane, bicyclo[3.2.1]octane, tricyclo[3.2.1.0$^{2,7}$]octane, spiro[3,4]octane, norbornane, norbornene, and tricyclo[3.3.1.1$^{3,7}$] decane (adamantane).

The polycyclic aliphatic ring is preferably a bicyclo ring or a tricyclo ring.

Examples of the bicyclo ring include norbornane, norbornene, spirobicyclopentane, bicyclo[2.1.0]pentane, bicyclo[3.2.1]octane, and spiro[3,4]octane.

Examples of the tricyclo ring include tricyclo[3.2.1.0$^{2,7}$] octane and tricyclo[3.3.1.1$^{3,7}$] decane (adamantane).

The aliphatic ring which may be substituted with a substituent means that one or more hydrogen atoms of the aliphatic ring may be substituted with a substituent described below.

The substituent is preferably selected from a hydroxy group, a linear or branched alkyl group having 1 to 10 carbon atoms, an alkoxy group having 1 to 20 carbon atoms, an acyloxy group having 1 to 10 carbon atoms which may be interrupted by an oxygen atom, and a carboxy group.

Examples of the alkoxy group having 1 to 20 carbon atoms include a methoxy group, an ethoxy group, an n-propoxy group, an i-propoxy group, an n-butoxy group, an i-butoxy group, an s-butoxy group, a t-butoxy group, an n-pentyloxy group, a 1-methyl-n-butoxy group, a 2-methyl-n-butoxy group, a 3-methyl-n-butoxy group, a 1,1-dimethyl-n-propoxy group, a 1,2-dimethyl-n-propoxy group, a 2,2-dimethyl-n-propoxy group, a 1-ethyl-n-propoxy group, an n-hexyloxy group, a 1-methyl-n-pentyloxy group, a 2-methyl-n-pentyloxy group, a 3-methyl-n-pentyloxy group, a 4-methyl-n-pentyloxy group, a 1,1-dimethyl-n-butoxy group, a 1,2-dimethyl-n-butoxy group, a 1,3-dimethyl-n-butoxy group, a 2,2-dimethyl-n-butoxy group, a 2,3-dimethyl-n-butoxy group, a 3,3-dimethyl-n-butoxy group, a 1-ethyl-n-butoxy group, a 2-ethyl-n-butoxy group, a 1,1,2-trimethyl-n-propoxy group, a 1,2,2-trimethyl-n-propoxy group, a 1-ethyl-1-methyl-n-propoxy group, a 1-ethyl-2-methyl-n-propoxy group, a cyclopentyloxy group, a cyclohexyloxy group, a norbornyloxy group, an adamantyloxy group, an adamantane methyloxy group, an adamantine ethyloxy group, a tetracyclodecanyloxy group, and a tricyclodecanyloxy group.

It is preferable that the aliphatic ring has at least one unsaturated bond (for example, a double bond or a triple bond). It is preferable that the aliphatic ring has one to three unsaturated bonds. It is preferable that the aliphatic ring has one or two unsaturated bonds. The unsaturated bond is preferably a double bond.

Specific examples of the compound containing an aliphatic ring which may be substituted with a substituent include the following compounds. The compound containing an aliphatic ring which may be substituted with a substituent also includes compounds in which the carboxy group in the following specific examples is replaced by a hydroxy group, an amino group, or a thiol group.

[Chem. 5]

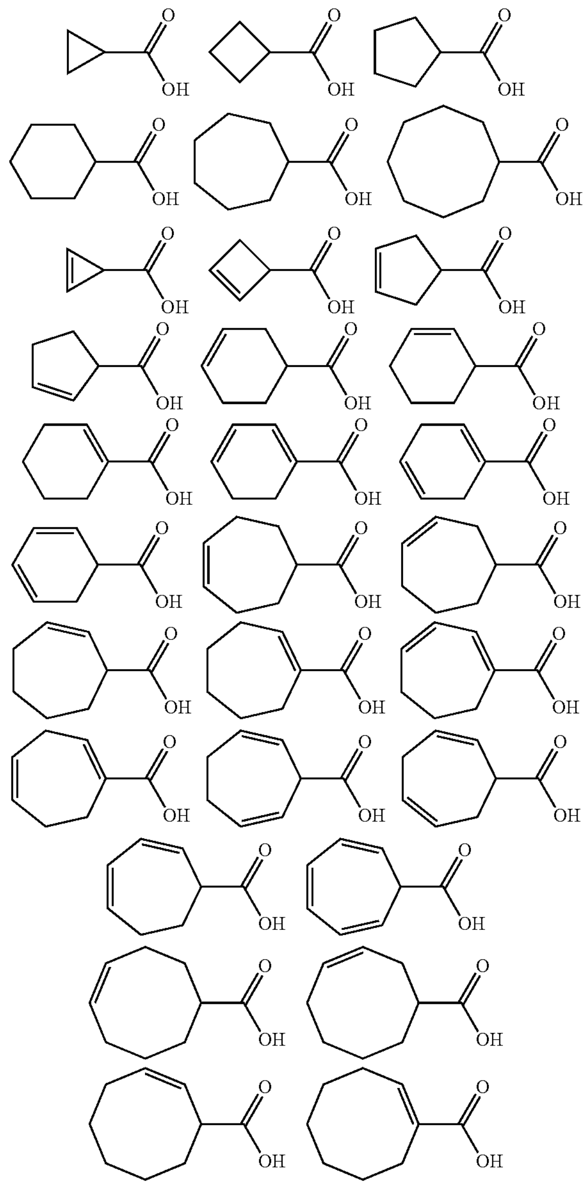

[Chem. 6]

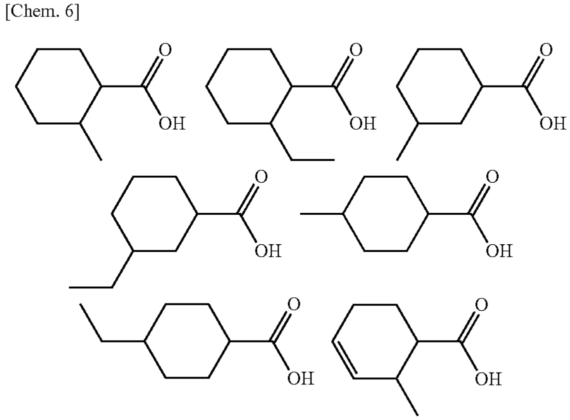

-continued
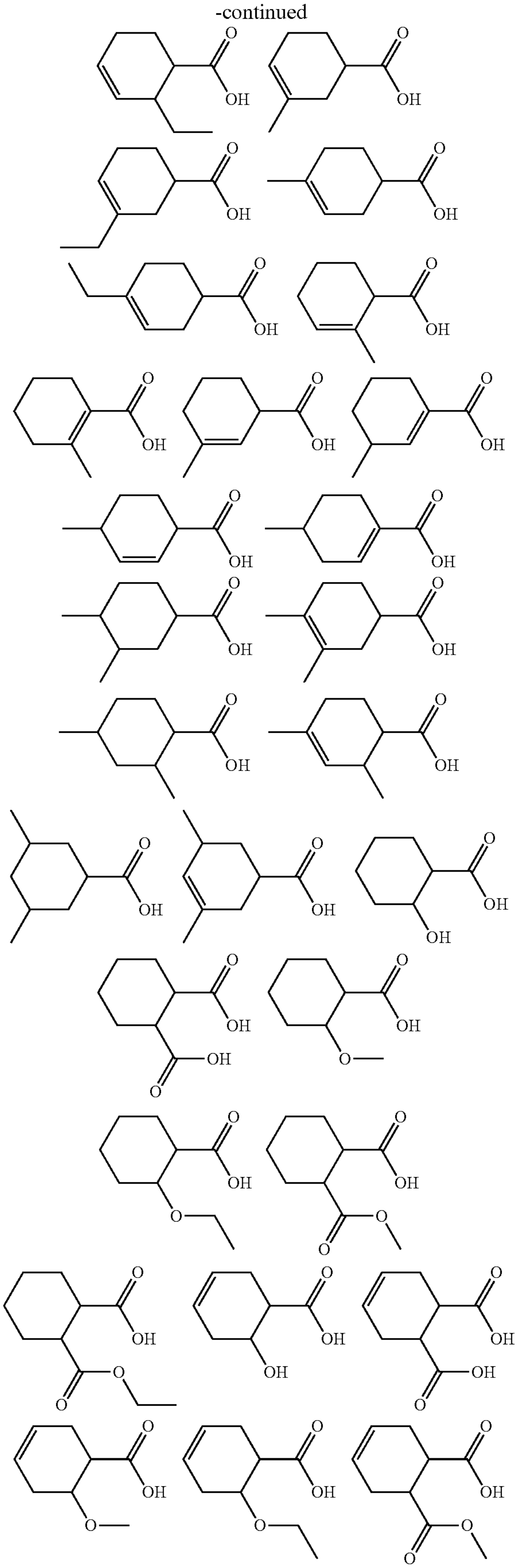
-continued
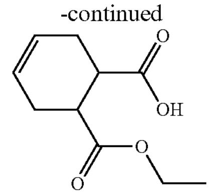
[Chem. 7]
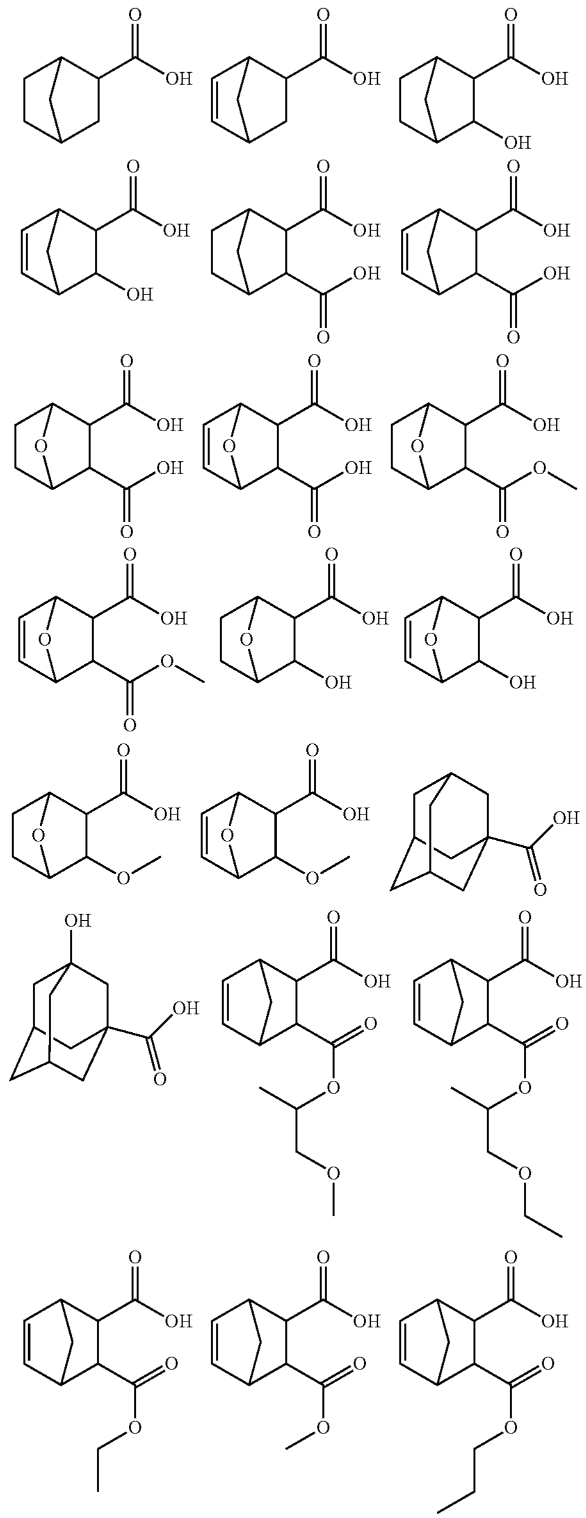

-continued

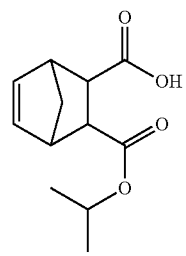

In a case where the compound shown above still maintains a carboxy group after polymer terminal reaction, said carboxy group may be allowed react with an alcohol compound. The alcohol compound may be an organic solvent contained in the resist underlayer film-forming composition.

Specific examples of the alcohol include propylene glycol monomethyl ether, propylene glycol monoethyl ether, methanol, ethanol, 1-propanol, and 2-propanol.

<Compound (A) [2]>

The compound (A) is preferably represented by the following Formula (1) and Formula (2).

[Chem. 8]

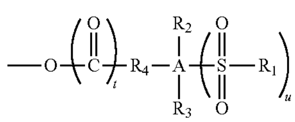

(1)

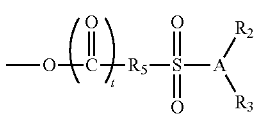

(2)

(In Formula (1) and Formula (2), $R_1$ represents an alkyl group having 1 to 6 carbon atoms which may have a substituent, a phenyl group, a pyridyl group, a halogeno group, or a hydroxy group; $R_2$ represents a hydrogen atom, an alkyl group having 1 to 6 carbon atoms, a hydroxy group, a halogeno group, or an ester group represented by —C(═O)O—X, X represents an alkyl group having 1 to 6 carbon atoms which may have a substituent; $R_3$ represents a hydrogen atom, an alkyl group having 1 to 6 carbon atoms, a hydroxy group, or a halogeno group; $R_4$ represents a direct bond or a divalent organic group having 1 to 8 carbon atoms; $R_5$ represents a divalent organic group having 1 to 8 carbon atoms; A represents an aromatic ring or an aromatic heterocyclic ring; t represents 0 or 1; and u represents 1 or 2.)

With regard to Formula (1) and Formula (2), the disclosure of WO 2015/163195 A is incorporated into the present application by reference in its entirety.

The polymer terminal structures represented by Formula (1) and Formula (2) can be produced by a reaction between the polymer and a compound represented by the following Formula (1a) and/or a compound represented by the following Formula (2a).

[Chem. 9]

(1a)

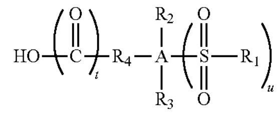

(2a)

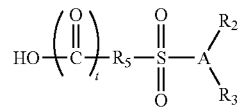

(The symbols in Formula (1a) and Formula (2a) are as defined in Formula (1) and Formula (2).)

Examples of the compound represented by Formula (1a) include compounds represented by the following formulas.

[Chem. 10]

(1a-1)

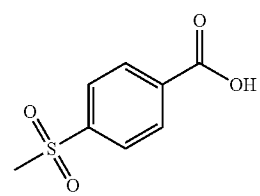

(1a-2)

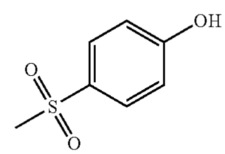

(1a-3)

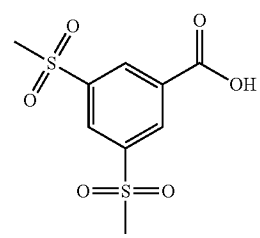

(1a-4)

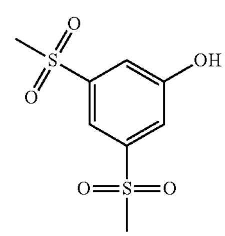

(1a-5)

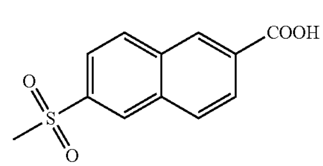

(1a-6)

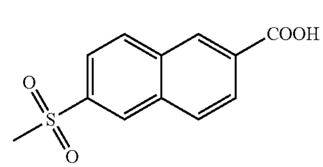

-continued
(1a-7)
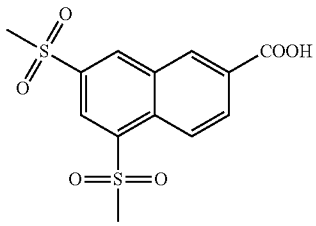
(1a-8)
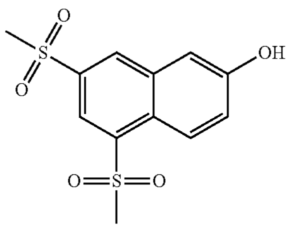
(1a-9)
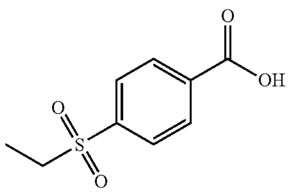
(1a-10)
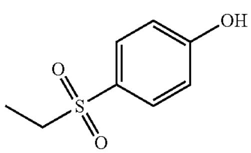
(1a-11)
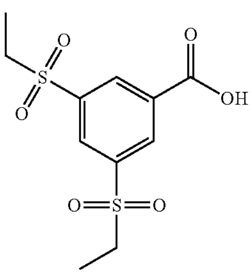
(1a-12)
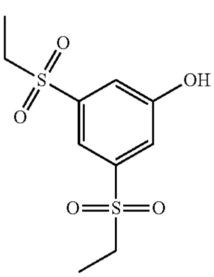
(1a-13)
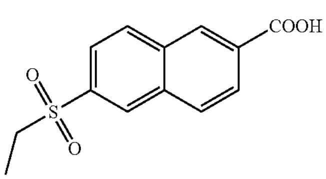
-continued
(1a-14)
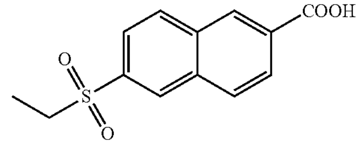
(1a-15)
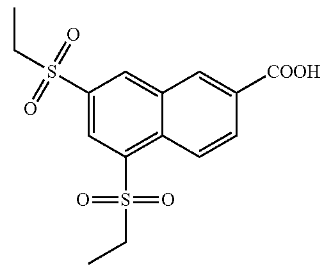
(1a-16)
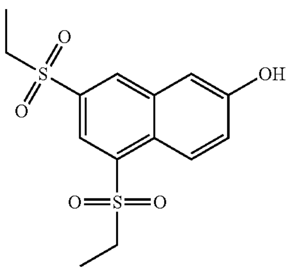
(1a-17)
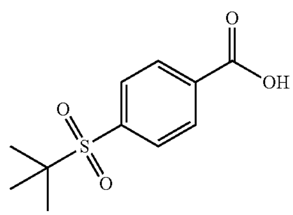
(1a-18)
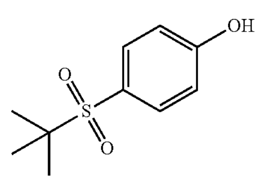
(1a-19)
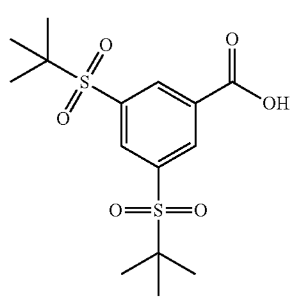

-continued
(1a-20)
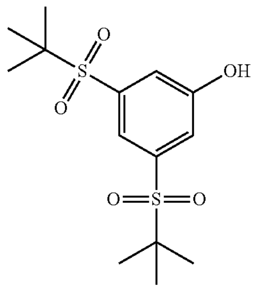
[Chem. 11]
(1a-21)
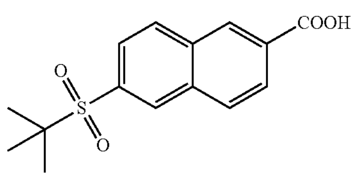
(1a-22)
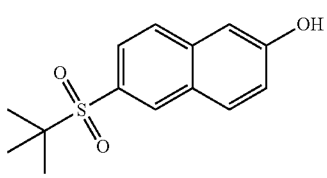
(1a-23)
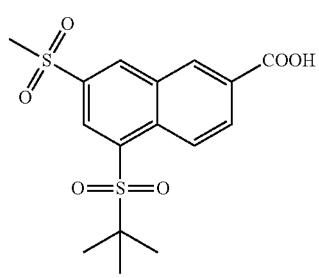
(1a-24)
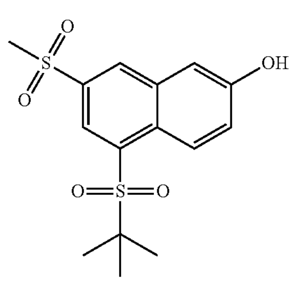
(1a-25)
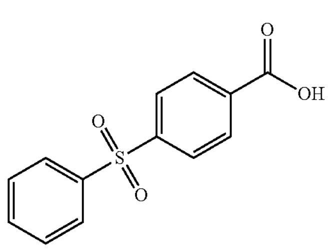
-continued
(1a-26)
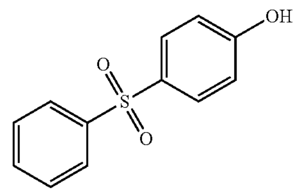
(1a-27)
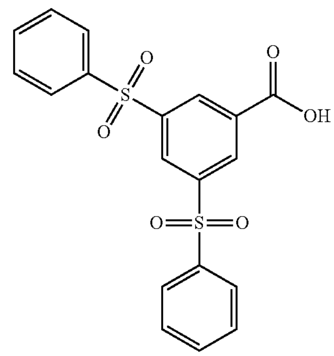
(1a-28)
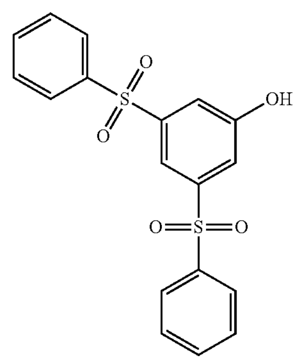
(1a-29)
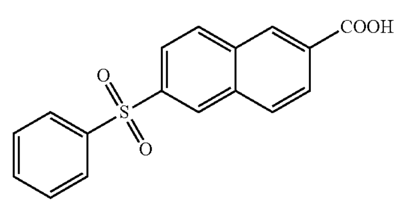
(1a-30)
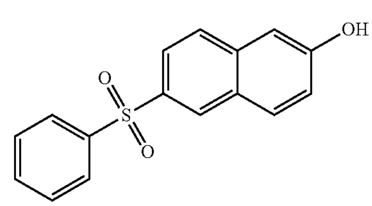

-continued
(1a-31)
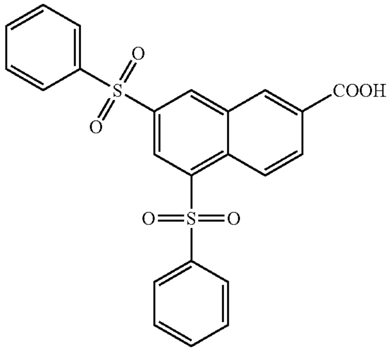
(1a-32)
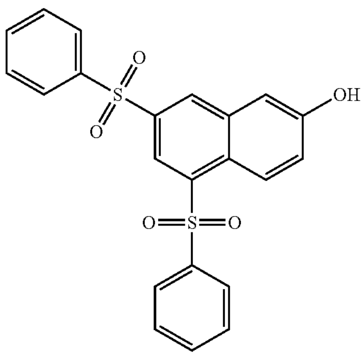
[Chem. 12]
(1a-33)
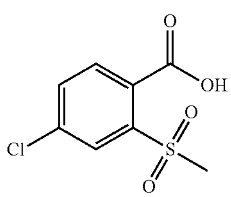
(1a-34)
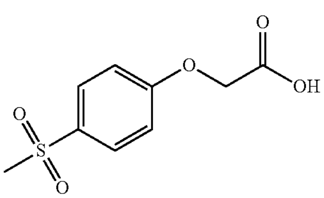
(1a-35)
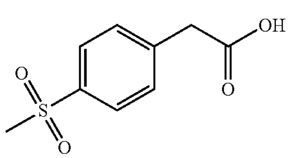
(1a-36)
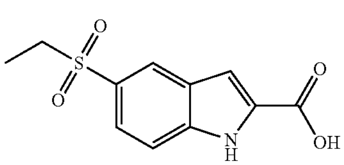
-continued
(1a-37)
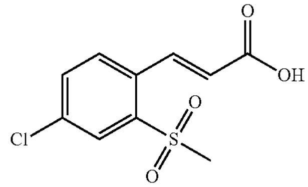
(1a-38)
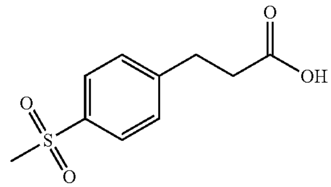
(1a-39)
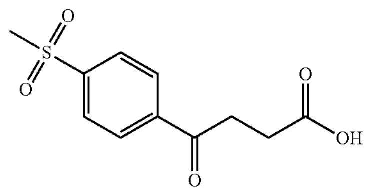
(1a-40)
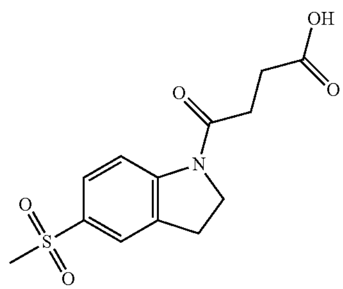
(1a-41)
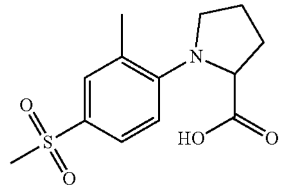
(1a-42)
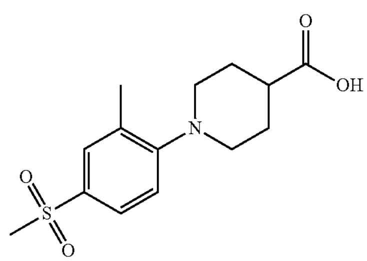
(1a-43)
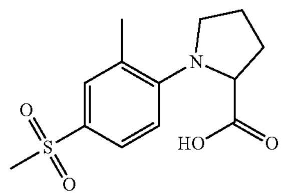

-continued
(1a-44)
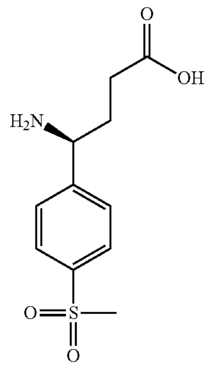
(1a-45)
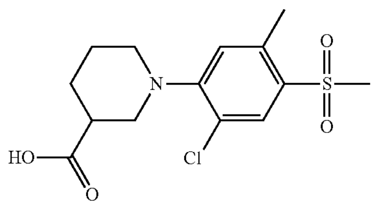
(1a-46)
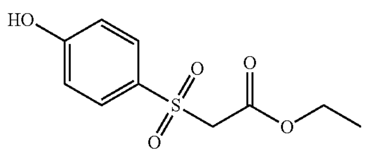
[Chem. 13]
(1a-47)
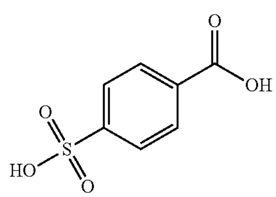
(1a-48)
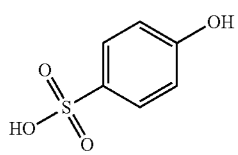
(1a-49)
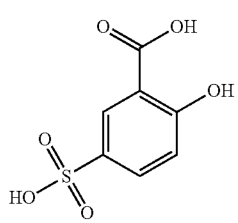
(1a-50)
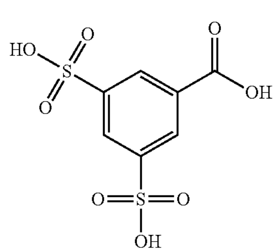
-continued
(1a-51)
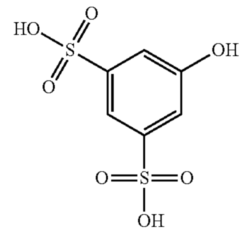
(1a-52)
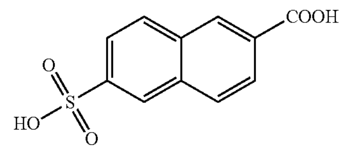
(1a-53)
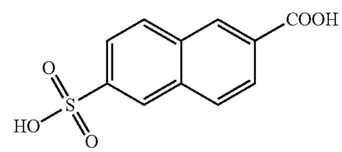
(1a-54)
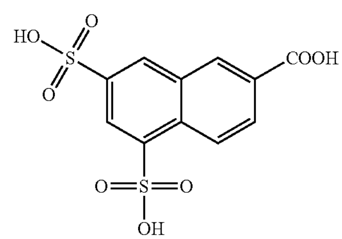
(1a-55)
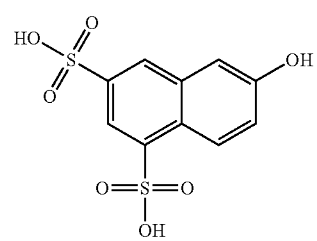
(1a-56)
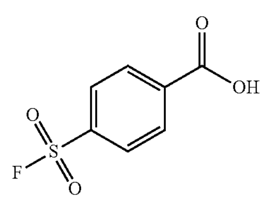
(1a-57)
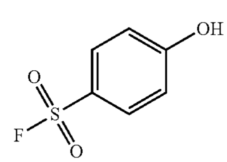
(1a-58)
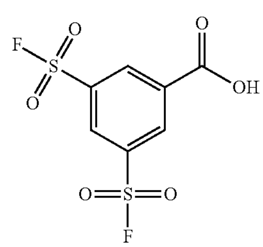

-continued
(1a-59)
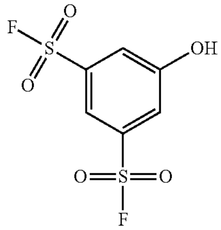
(1a-60)
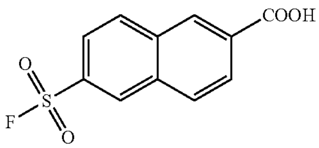
(1a-61)
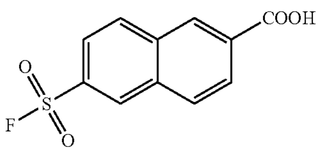
(1a-62)
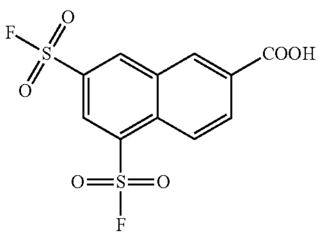
(1a-63)
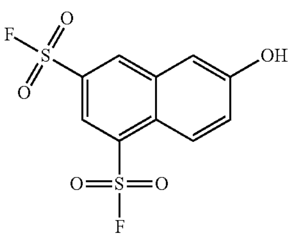
(1a-64)
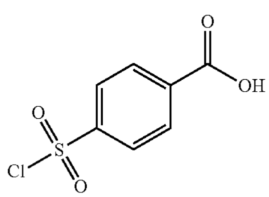
(1a-65)
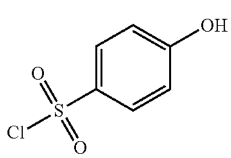
(1a-66)
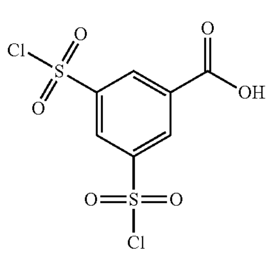
-continued
(1a-67)
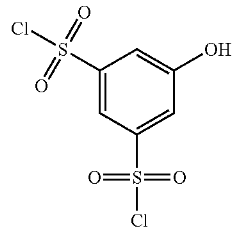
(1a-68)
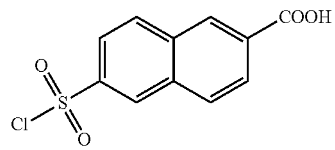
(1a-69)
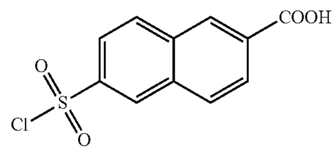
(1a-70)
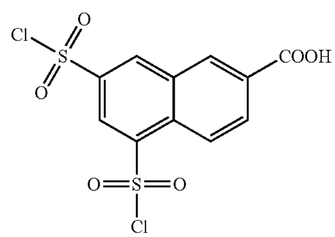
(1a-71)
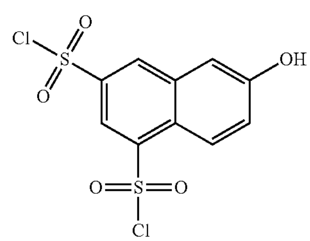
[Chem. 14]
(1a-72)
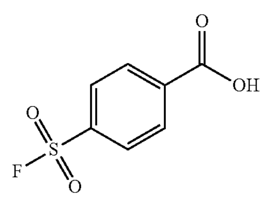
(1a-73)
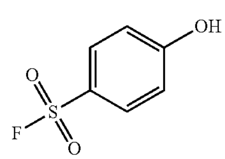

-continued
(1a-74)
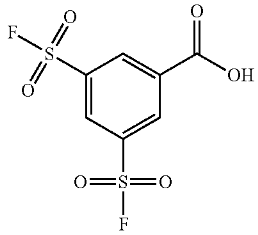
(1a-75)
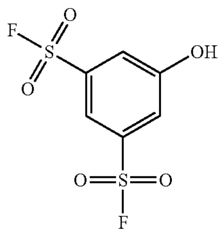
(1a-76)
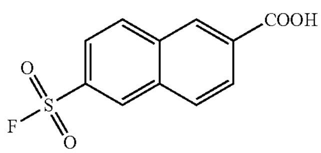
(1a-77)
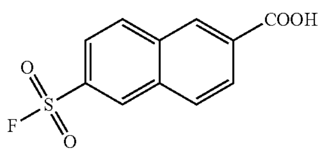
(1a-78)
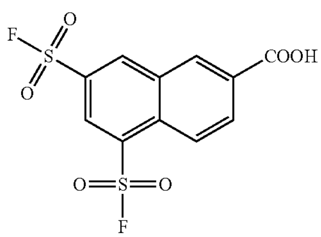
(1a-79)
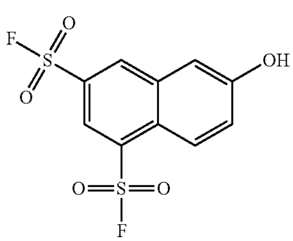
(1a-80)
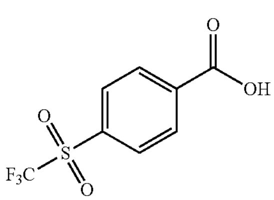
(1a-81)
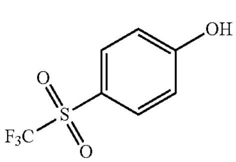
-continued
(1a-82)
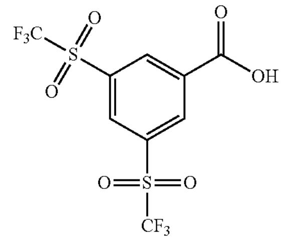
(1a-83)
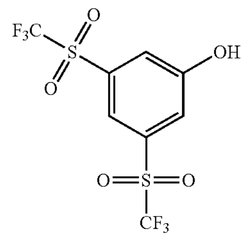
(1a-84)
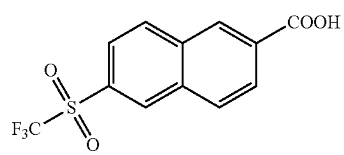
(1a-85)
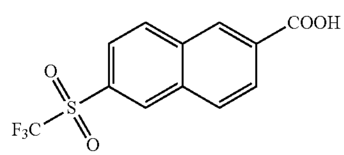
(1a-86)
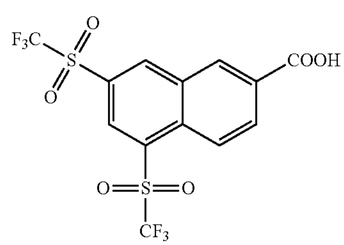
(1a-87)
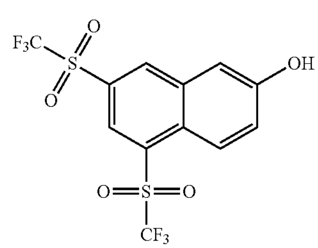

Examples of the compound represented by Formula (2a) include compounds represented by the following formulas.

[Chem. 15]

(2a-1)

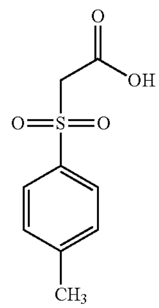

(2a-2)

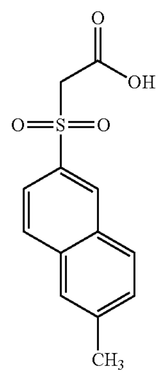

(2a-3)

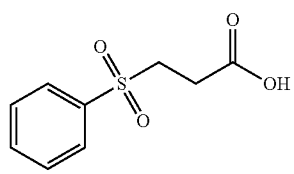

(2a-4)

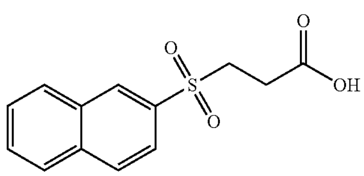

(2a-5)

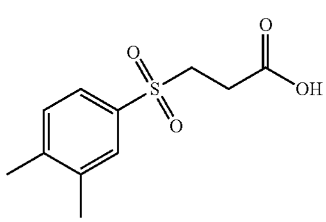

(2a-6)

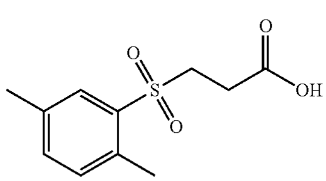

-continued (2a-7)

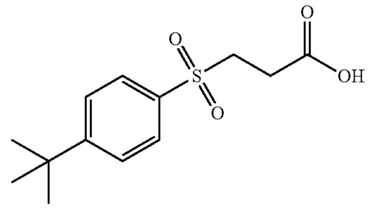

(2a-8)

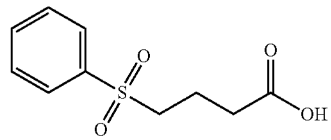

(2a-9)

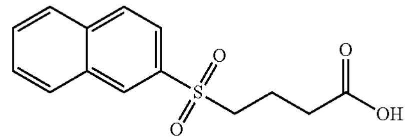

(2a-10)

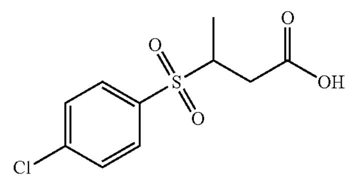

(2a-11)

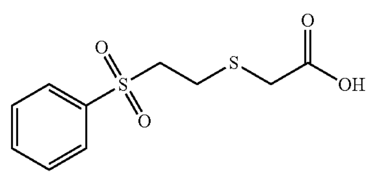

(2a-12)

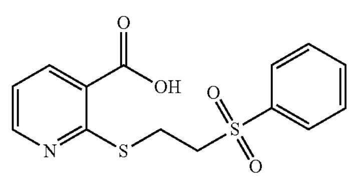

(2a-13)

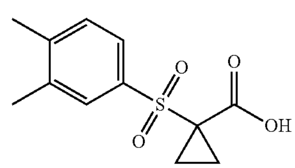

In a case where the compound described above still maintains a carboxy group after polymer terminal reaction, said carboxy group may be allowed react with an alcohol compound. The alcohol compound may be an organic solvent contained in the resist underlayer film-forming composition.

Specific examples of the alcohol include propylene glycol monomethyl ether, propylene glycol monoethyl ether, methanol, ethanol, 1-propanol, and 2-propanol.

<Acid Generator>

As the acid generator contained as an optional component in the resist underlayer film-forming composition of the present invention, both a thermal acid generator and a photoacid generator may be used, but it is preferable to use a thermal acid generator. Examples of the thermal acid generator include sulfonic acid compounds and carboxylic acid compounds such as p-toluenesulfonic acid, trifluoromethanesulfonic acid, pyridinium p-toluenesulfonate (pyridinium p-toluenesulfonic acid), pyridinium p-hydroxybenzenesulfonic acid (p-phenolsulfonic acid pyridinium salt), pyridinium-trifluoromethanesulfonic acid, salicylic acid, camphorsulfonic acid, 5-sulfosalicylic acid, 4-chlorobenzenesulfonic acid, 4-hydroxybenzenesulfonic acid, benzenedisulfonic acid, 1-naphthalenesulfonic acid, citric acid, benzoic acid, hydroxybenzoic acid, N-methylmorpholine p-toluenesulfonic acid, N-methylmorpholine p-hydroxybenzenesulfonic acid, and N-methylmorpholine 5-sulfosalicylic acid.

Examples of the photoacid generator include an onium salt compound, a sulfonimide compound, and a disulfonyl diazomethane compound.

Examples of the onium salt compound include iodonium salt compounds such as diphenyliodoniumhexafluorophosphate, diphenyliodoniumtrifluoromethanesulfonate, diphenyliodoniumnonafluoro n-butane sulfonate, diphenyliodoniumperfluoro n-octane sulfonate, diphenyliodoniumcamphorsulfonate, bis(4-tert-butyl phenyl)iodoniumcamphorsulfonate, and bis(4-tert-butylphenyl)iodoniumtrifluoromethanesulfonate; and sulfonium salt compounds such as triphenyisulfoniumhexafluoroantimonate, triphenylsulfoniumnonafluoro n-butane sulfonate, triphenylsuifoniumcamphorsulfonate, and triphenylsulfoniumfluoromethanesulfonate.

Examples of the sulfonimide compound include N-(trifluoromethanesulfonyloxy)succinimide, N-(nonafluoro n-butanesulfonyloxy)succinimide, N-(camphorsulfonyloxy)succinimide, and N-(trifluoromethanesulfonyloxy) naphthalimide.

Examples of the disulfonyldiazomethane compound include bis(trifluoromethylsulfonyl)diazomethane, bis(cyclohexylsulfonyl)diazomethane, bis(phenylsulfonyl)diazomethane, bis(p-toluenesulfonyl)diazomethane, bis(2,4-dimethylbenzenesulfonyl)diazomethane, and methylsulfonyl-p-toluenesulfonyldiazomethane.

As the acid generator, only one species of an acid generator may be used, or two or more species of acid generators may be used in combination.

In a case where an acid generator is used, the content ratio of said acid generator is, for example, within the range of 0.1% by mass to 50% by mass, and preferably, 1% by mass to 30% by mass, relative to the following crosslinking agent.

<Crosslinking Agent>

Examples of a crosslinking agent contained as an optional component in the resist underlayer film-forming composition of the present invention include hexamethoxymethylmelamine, tetramethoxymethyl benzoguanamine, 1,3,4,6-tetrakis(methoxymethyl)glycoluril (tetramethoxymethyl glycoluril) (POWDERLINK [registered trademark] 1174), 1,3,4,6-tetrakis(butoxymethyl)glycoluril, 1,3,4,6-tetrakis (hydroxymethyl)glycoluril, 1,3-bis(hydroxymethyl)urea, 1,1,3,3-tetrakis(butoxymethyl)urea, and 1,1,3,3-tetrakis (methoxymethyl)urea.

In addition, the crosslinking agent of the present application may be a nitrogen-containing compound having 2 to 6 substituents represented by the following Formula (1d) bonded to a nitrogen atom per molecule, which is described in WO 2017/187969 A.

[Chem. 16]

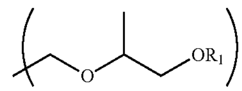

(1d)

(In Formula (1d), $R_1$ represents a methyl group or an ethyl group.)

The nitrogen-containing compound having 2 to 6 substituents represented by Formula (1d) per molecule may be a glycoluril derivative represented by the following Formula (1E).

[Chem. 17]

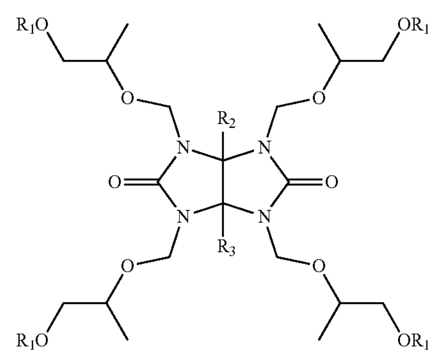

(1E)

(In Formula (1E), four $R_1$'s each independently represent a methyl group or an ethyl group; and $R_2$ and $R_3$ each independently represent a hydrogen atom, an alkyl group having 1 to 4 carbon atoms, or a phenyl group.)

Examples of the glycoluril derivative represented by Formula (1E) include compounds represented by the following Formula (1E-1) to Formula (1E-6).

[Chem. 18]

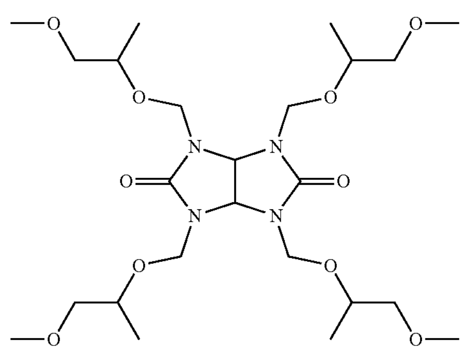

(1E-1)

-continued (1E-2)

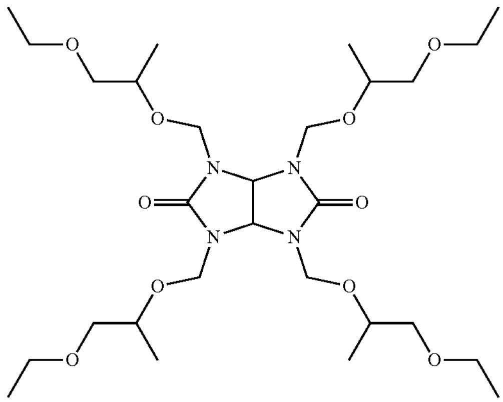

(1E-3)

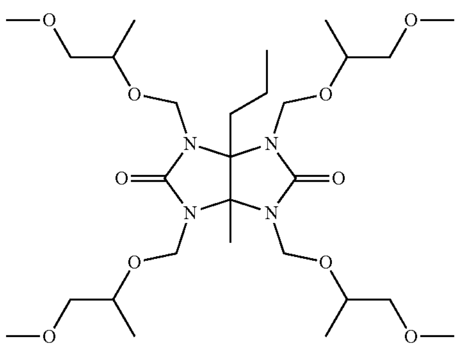

(1E-4)

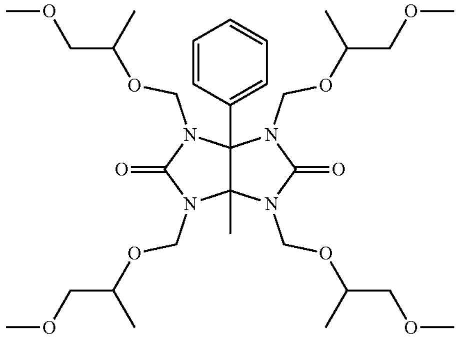

(1E-5)

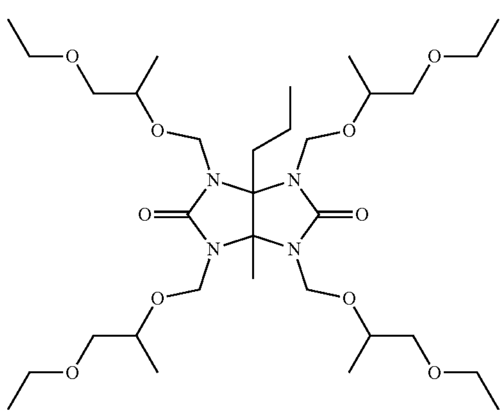

-continued (1E-6)

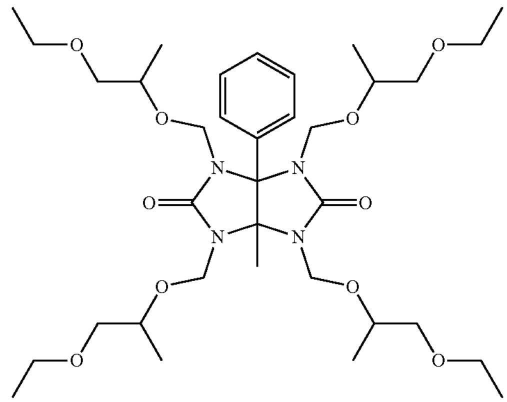

The nitrogen-containing compound having 2 to 6 substituents represented by Formula (1d) per molecule is obtained by reacting a nitrogen-containing compound having per molecule 2 to 6 substituents represented by the following Formula (2d) bonded to a nitrogen atom with at least one compound represented by the following Formula (3d).

[Chem. 19]

(2d)

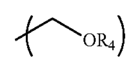

(3d)

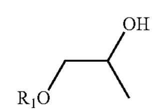

In Formula (3d), $R_1$ represents a methyl group or an ethyl group; and in Formula (2d), $R_4$ represents an alkyl group having 1 to 4 carbon atoms.)

The glycoluril derivative represented by Formula (1E) is obtained by reacting a glycoluril derivative represented by the following Formula (2E) with at least one compound represented by Formula (3d).

The nitrogen-containing compound having 2 to 6 substituents represented by Formula (2d) per molecule is, for example, a glycoluril derivative represented by the following Formula (2E).

[Chem. 20]

(2E)

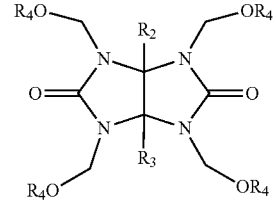

(In Formula (2E), $R_1$ and $R_3$ each independently represent a hydrogen atom, an alkyl group having 1 to 4 carbon atoms, or a phenyl group; and $R_4$'s each independently represent an alkyl group having 1 to 4 carbon atoms.)

Examples of the glycoluril derivative represented by Formula (2E) include compounds represented by the following Formula (2E-1) to Formula (2E-4). Further, examples of the compound represented by Formula (3d) include compounds represented by the following Formula (3d-1) and Formula (3d-2).

[Chem. 21]

(2E-1)

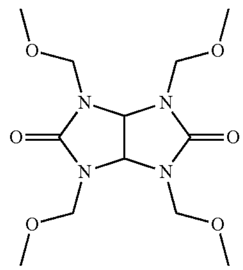

(2E-2)

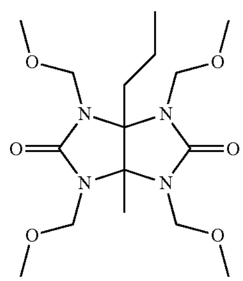

(2E-3)

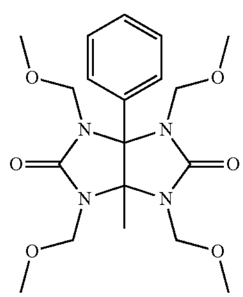

(2E-4)

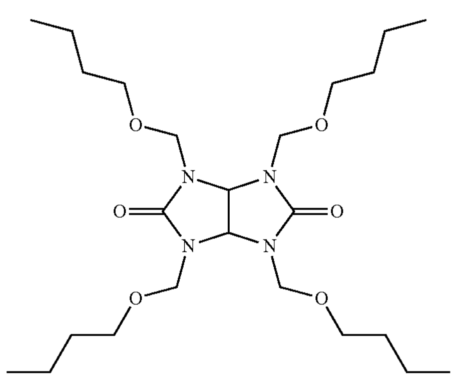

[Chem. 22]

(3d-1)

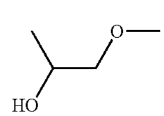

-continued (3d-2)

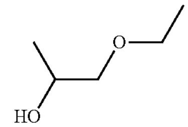

With regard to the nitrogen-containing compound having per molecule 2 to 6 substituents represented by the following Formula (1d) bonded to a nitrogen atom, the disclosure of WO 2017/187969 A is incorporated into the present application by reference in its entirety.

In a case where a crosslinking agent is used, the content ratio of the crosslinking agent is, for example, within the range of 1% by mass to 50% by mass, and preferably, 5% by mass to 30% by mass, relative to the reaction product.

<Other Components>

In order to prevent occurrence of pinholes, striations, or the like, and further improve the applicability for surface unevenness, a surfactant may further be added to the resist underlayer film-forming composition of the present invention. Examples of the surfactant include nonionic surfactants such as polyoxyethylene alkyl ethers such as polyoxyethylene lauryl ether, polyoxyethylene stearyl ether, polyoxyethylene cetyl ether, and polyoxyethylene oleyl ether, polyoxyethylene alkylallyl ethers such as polyoxyethylene octylphenol ether and polyoxyethylene nonylphenol ether, polyoxyethylene-polyoxypropylene block copolymers, sorbitan fatty acid esters such as sorbitan monolaurate, sorbitan monopalmitate, sorbitan monostearate, sorbitan monooleate, sorbitan trioleate, and sorbitan tristearate, polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; fluorine-based surfactants such as EFTOP EF301, EF303, and EF352 (manufactured by Tochem Products Co. Ltd., trade name), Megafac F171, F173, and R-30 (manufactured by Dainippon Ink Co., Ltd., trade name), Fluorad FC430 and FC431 (manufactured by Sumitomo 3M Limited, trade name), and AsahiCivard AG-710 and Surflon S-382, SC101, SC102, SC103, SC104, SC105, and SC106 (manufactured by AGC Inc.), and Organosiloxane polymer KP341 (manufactured by Shin-Etsu Chemical Co., Ltd.). The blending amount of these surfactants is usually 2.0% by mass or less, and preferably 1.0% by mass or less, relative to the total solid content of the resist underlayer film-forming composition of the present invention. These surfactants may be added each alone or in combination of two or more thereof.

The resist underlayer film-forming composition of the present invention is preferably an electron beam resist underlayer film-forming composition or an EUV resist underlayer film-forming composition used in an electron beam (EB) drawing process and an EUV exposure process, and is preferably an EUV resist underlayer film-forming composition.

<Resist Underlayer Film>

The resist underlayer film according to the present invention may be manufactured by applying the resist underlayer film-forming composition described above onto a semiconductor substrate followed by baking.

The resist underlayer film according to the present invention is preferably an electron beam resist underlayer film or an EUV resist underlayer film.

Examples of the semiconductor substrate on which the resist underlayer film-forming composition of the present invention is applied include a silicon wafer, a germanium wafer, and a semiconductor wafer formed of a compound such as gallium arsenide, indium phosphide, gallium nitride, indium nitride, or aluminum nitride.

In a case where a semiconductor substrate having an inorganic film formed on a surface thereof is used, the inorganic film is formed by, for example, an atomic layer deposition (ALD) method, a chemical vapor deposition (CVD) method, a reactive sputtering method, an ion-plating method, a vacuum deposition method, or a spin coating method (spin on glass: SOG). Examples of the inorganic film include a polysilicon film, a silicon oxide film, a silicon nitride film, a Boro-Phospho Silicate Glass (BPSG) film, a titanium nitride film, a titanium nitride oxide film, a tungsten film, a gallium nitride film, and a gallium arsenide film.

The resist underlayer film-forming composition of the present invention is applied onto the semiconductor substrate by an appropriate application method such as a spinner or a coater. Thereafter, baking is performed using heating means such as a hot plate to form a resist underlayer film. Conditions for baking are appropriately selected from a baking temperature of 100° C. to 400° C. and a baking time of 0.3 minutes to 60 minutes. Preferably, the baking temperature is 120° C. to 350° C. and the baking time is 0.5 minutes to 30 minutes, and more preferably, the baking temperature is 150° C. to 300° C. and the baking time is 0.8 minutes to 10 minutes.

The thickness of a resist underlayer film to be formed is, for example, within the range of 0.001 μm (1 nm) to 10 μm, 0.002 μm (2 nm) to 1 μm, 0.005 μm (5 nm) to 0.5 μm (500 nm), 0.001 μm (1 nm) to 0.05 μm (50 nm), 0.002 μm (2 nm) to 0.05 μm (50 nm), 0.003 μm (1 nm) to 0.05 μm (50 nm), 0.004 μm (4 nm) to 0.05 μm (50 nm), 0.005 μm (5 nm) to 0.05 μm (50 nm), 0.003 μm (3 nm) to 0.03 μm (30 nm), 0.003 μm (3 nm) to 0.02 μm (2.0 nm), or 0.005 μm (5 nm) to 0.02 μm (20 nm). In a case where the temperature during baking is lower than the above range, crosslinking becomes insufficient. To the contrary, when the temperature during the baking is higher than the above range, the resist underlayer film may be decomposed by heat.

<Method for Manufacturing Patterned Substrate and Method for Manufacturing Semiconductor Device>

The method for manufacturing a patterned substrate includes the following steps. Usually, a photoresist layer is formed on a resist underlayer film. A photoresist formed with a method known per se by being applied on the resist underlayer film followed by baking is not particularly limited as long as it is sensitive to a light used for exposure. Either a negative photoresist or a positive photoresist may be used. Examples of the photoresist include a positive photoresist formed of a novolac resin and 1,2-naphthoquinonediazide sulfonic acid ester; a chemically amplified photoresist formed of a binder having a group degradable by an acid to increase an alkali dissolution rate and a photoacid generator; a chemically amplified photoresist formed of a low-molecular-weight compound degradable by an acid to increase an alkali dissolution rate of the photoresist, an alkali-soluble binder, and a photoacid generator; a chemically amplified photoresist formed of a binder having a group degradable by an acid to increase an alkali dissolution rate, a low-molecular-weight compound degradable by an acid to increase an alkali dissolution rate of the photoresist, and a photoacid generator; and a resist containing metal elements. Examples thereof include V146G (trade name) manufactured by JSR Corporation, APEX-E (trade name) manufactured by Shipley Company L.L.C, PAR710 (trade name) manufactured by Sumitomo Chemical Co., Ltd., and AR2772 and SEPR430 (trade name) manufactured by Shin-Etsu Chemical Co., Ltd. In addition, examples thereof include a fluorine-containing atomic polymer-based photoresist as described in Proc. SPIE, Vol. 3999, 330-334 (2000), Proc. SPIE, Vol. 3999, 357-364 (2000), and Proc. SPIE, Vol, 3999, 365-374 (2000). In addition, the photoresist may be one of the so-called metal-containing resists (metal resists). As specific examples, the resist compositions described in WO 2019/188595 A, WO 2019/187881 A, WO 2019/187803 A, WO 2019/167737 A, WO 2019/167725 A, WO 2019/187445 A, WO 2019/167419 A, WO 2019/123842 A, WO 2019/054282 A, WO 2019/058945 A, WO 2019/058890 A, WO 2019/039290 A, WO 2019/044259 A, WO 2019/044231 A, WO 2019/026549 A, WO 2018/193954 A, WO 2019/172054 A, WO 2019/021975 A, WO 2018/230334 A, WO 2018/194123 A, JP 2018-180525 A, WO 2018/190088 A, JP 2018-070596 A, JP 2018-028090 A, JP 2016-153409 A, JP 2016-130240 A, JP 2016-108325 A, JP 2016-047920 A, JP 2016-035570 A, JP 2016-035567 A, JP 2016-035565 A, JP 2019-101417 A, JP 2019-117373 A, JP 2019-052294 A, JP 2019-008280 A, JP 2019-008279 A, JP 2019-003176 A, JP 2019-003175 A, JP 2018-197853 A, JP 2019-191298 A, JP 2019-061217 A, JP 2018-045152 A, JP 2018-022039 A, JP 2016-090441 A, JP 2015-10878 A, JP 2012-168279 A, JP 2012-022261 A, JP 2012-022258 A, JP 2011-043749 A, JP 2010-181857 A, JP 2010-128369 A, WO 2018/031896 A, JP 2019-113855 A, WO 2017/156388 A, WO 2017/066319 A, JP 2018-41099 A, WO 2016/065120 A, WO 2015/026482 A, JP 2016-29498 A, JP 2011-253185 A, and the like, the so-called resist compositions such as a radiation-sensitive resin composition and a high-resolution patterning composition based on an organometallic solution, and a metal-containing resist composition may be used, but are not limited thereto.

Examples of the resist composition include the following.

An active ray-sensitive or radiation-sensitive resin composition containing: a resin A having a repeating unit having an acid-decomposable group in which a polar group is protected by a protective group that is eliminated by an action of an acid; and a compound represented by General Formula (1).

[Chem. 23]

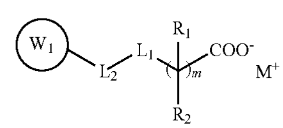

(1)

In General Formula), m represents an integer of 1 to 6.

$R_1$ and $R_2$ each independently represent a fluorine atom or a perfluoroalkyl group.

$L_1$ represents —O—, —S—, —COO—, —$SO_2$—, or —$SO_3$—.

$L_2$ represents a single bond or an alkylene group which may have a substituent.

$W_1$ represents a cyclic organic group which may have a substituent.

$M^+$ represents a cation.

A metal-containing film-forming composition for extreme ultraviolet ray or electron beam lithography, containing: a compound having a metal-oxygen covalent bond; and a solvent, in which the metal element constituting the compound belong to the third to seventh periods of Groups 3 to 15 of the periodic table.

A radiation-sensitive resin composition containing: a polymer having a first structural unit represented by the following Formula (1) and a second structural unit having an acid-dissociable group represented by the following Formula (2); and an acid generator.

[Chem. 24]

(1)

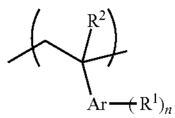

(2)

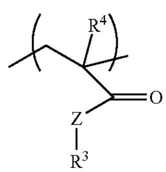

(In Formula (1), Ar is a group obtained by removing (n+1) hydrogen atoms from an arene having 6 to 20 carbon atoms; $R^1$ is a hydroxy group, a sulfanyl group, or a monovalent organic group having 1 to 20 carbon atoms; n is an integer of 0 to 11, in which when n is 2 or more, a plurality of $R^1$'s are the same as or different from each other, and $R^2$ is a hydrogen atom, a fluorine atom, a methyl group, or a trifluoromethyl group.

In Formula (2), $R^3$ is a monovalent group having 1 to 20 carbon atoms which has an acid-dissociable group; Z is a single bond, an oxygen atom, or a sulfur atom; and $R^4$ is a hydrogen atom, a fluorine atom, a methyl group, or a trifluoromethyl group.)

A resist composition containing: a resin (A1) having a structural unit having a cyclic carbonic acid ester structure, a structural unit represented by Formula (II), and a structural unit having an acid-unstable group; and an acid generator.

[Chem. 25]

(II)

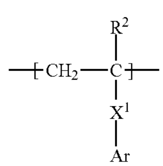

[In Formula (II), $R^2$ represents an alkyl group having 1 to 6 carbon atoms which may have a halogen atom, a hydrogen atom, or a halogen atom; $X^1$ represents a single bond, —CO—O—*, or —CO—$NR^4$—*; * represents a bond with Ar; $R^4$ represents a hydrogen atom or an alkyl group having 1 to 4 carbon atoms; and Ar represents an aromatic hydrocarbon group having 6 to 20 carbon atoms which may have one or more groups selected from the group consisting of a hydroxy group and a carboxy group.]

A resist composition of which the solubility in a developer is changed by an action of the acid generated by exposure, the resist composition containing:

a base component (A) having solubility in a developer that is changed by an action of an acid; and a fluorine additive component (F) exhibiting decomposability in an alkaline developer, in which the fluorine additive component (F) contains a fluororesin component (F1) having a structural unit (f1) containing a base-dissociable group and a structural unit (f2) containing a group represented by the following General Formula (f2-r-1).

[Chem. 26]

(f2-r-1)

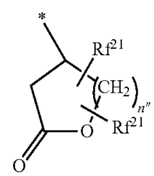

[In Formula (f2-r-1), $Rf^{21}$'s each independently represent a hydrogen atom, an alkyl group, an alkoxy group, a hydroxyl group, a hydroxyalkyl group, or a cyano group; n" is an integer of 0 to 2; and * represents a bond.]

In the resist composition, the structural unit (f1) includes a structural unit represented by the following General Formula (f1-1) or a structural unit represented by the following General Formula (f1-2).

[Chem. 27]

(f1-1)

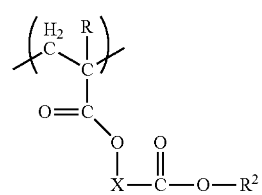

(f1-2)

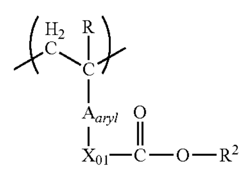

[In Formula (f1-1) and Formula (f-1-2), R's each independently represent a hydrogen atom, an alkyl group having 1 to 5 carbon atoms, or a halogenated alkyl group having 1 to 5 carbon atoms; X is a divalent linking group which does not have acid-dissociable site; $A_{aryl}$ is a divalent aromatic cyclic group which may have a substituent; $X_{01}$ is a single bond or a divalent linking group; and $R^2$'s each independently represent an organic group having a fluorine atom.]

Examples of a resist material include the following.

A resist material containing a polymer having a repeating unit represented by the following Formula (a1) or (a2).

[Chem. 28]

(a1)

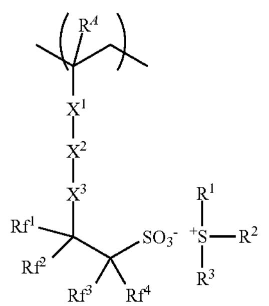

(a2)

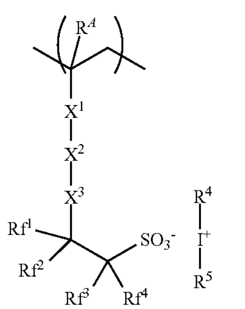

(In Formula (a1) and (a2), $R^A$ is a hydrogen atom or a methyl group; $X^1$ is a single bond or an ester group; $X^2$ is a linear, branched, or cyclic alkylene group having 1 to 12 carbon atoms or an arylene group having 6 to 10 carbon atoms, part of methylene groups constituting the alkylene group may be replaced by an ether group, an ester group, or a lactone ring-containing group, and at least one hydrogen atom contained in $X^2$ is replaced by a bromine atom; $X^3$ is a single bond, an ether group, an ester group, or a linear, branched, or cyclic alkylene group having 1 to 12 carbon atoms, and part of methylene groups constituting the alkylene group may be replaced by an ether group or an ester group; $Rf^1$ to $Rf^4$ each independently are a hydrogen atom, a fluorine atom, or a trifluoromethyl group, or at least one of $Rf^1$ to $Rf^4$ is a fluorine atom or a trifluoromethyl group, and $Rf^1$ and $Rf^2$ may combine with each other to form a carbonyl group; $R^1$ to $R^5$ are each independently a linear, branched, or cyclic alkyl group having 1 to 12 carbon atoms, a linear, branched, or cyclic alkenyl group having 2 to 12 carbon atoms, an alkynyl group having 2 to 12 carbon atoms, an aryl group having 6 to 20 carbon atoms, an aralkyl group having 7 to 12 carbon atoms, or an aryloxyalkyl group having 7 to 12 carbon atoms, part or all of the hydrogen atoms in these groups may be replaced by a hydroxy group, a carboxy group, a halogen atom, an oxo group, a cyano group, an amide group, a nitro group, a sulfone group, a sulfone group, or a sulfonium salt-containing group, part of methylene groups constituting these groups may be replaced by an ether group, an ester group, a carbonyl group, a carbonate group, or a sulfonic acid ester group, and $R^1$ and $R^2$ may combine with each other to forth a ring together with a sulfur atom to which they are bonded.)

A resist material containing a base resin containing a polymer having a repeating unit represented by the following Formula (a).

[Chem. 29]

(a)

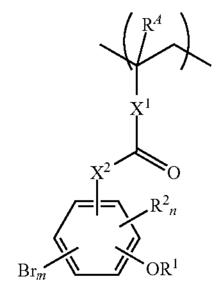

(In Formula (a), $R^A$ is a hydrogen atom or a methyl group; $R^1$ is a hydrogen atom or an acid-unstable group; $R^2$ is a linear, branched, or cyclic alkyl group having 1 to 6 carbon atoms or a halogen atom other than bromine; $X^1$ is a single bond, a phenylene group, or a linear, branched, or cyclic alkylene group having 1 to 12 carbon atoms which may have an ester group or a lactone ring; $X^2$ is —O—, —O—$CH_2$—, or —NH—; m is an integer of 1 to 4; and n is an integer of 0 to 3.)

Examples of the resist film include the following.

(i) A resist film containing a base resin having a repeating unit represented by the following Formula (a1) and/or a repeating unit represented by the following Formula (a2), and a repeating unit that generates an acid bonded to a polymer main chain by exposure.

[Chem. 30]

(a1)

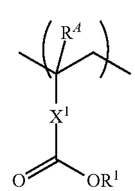

-continued (a2)

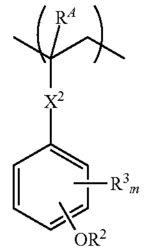

(In Formula (a1) and (a2), $R^A$'s are each independently a hydrogen atom or a methyl group; $R^1$ and $R^2$ are each independently a tertiary alkyl group having 4 to 6 carbon atoms; $R^3$'s are each independently a fluorine atom or a methyl group; in is an integer of 0 to 4; $X^1$ is a single bond, a phenylene group, or a naphthylene group, a linking group having 1 to 12 carbon atoms which contains at least one selected from an ester bond, a lactone ring, a phenylene group, and a naphthylene group; and $X^2$ is a single bond, an ester bond, or an amide bond.)

Examples of a coating solution include the following.

A coating containing, as a metal-containing, resist composition, for example, a metal oxo-hydroxo network having an organic ligand by a metal carbon bond and/or a metal carboxylate bond.

Inorganic Oxo/Hydroxo-Based Composition.

A coating solution containing: an organic solvent; a first organometallic composition represented by Formula $R_2SnO_{(2-(z/2)-(x/2))}(OH)_x$ (where $0<z\leq 2$ and $0<(z+x)\leq 4$), Formula $R'_nSnX_{4-n}$ (where n=1 or 2), or a mixture thereof, where R and R' are independently a hydrocarbyl group having 1 to 31 carbon atoms, and X is a ligand having a hydrolyzable bond to Sn or a combination thereof; and a hydrolyzable metal compound represented by $MX'_v$ (where M is a metal selected from Groups 2 to 16 of the periodic table of the elements, v=number of 2 to 6, and X' is a ligand having a hydrolyzable M-X bond or a combination thereof).

A coating solution containing: an organic solvent; and a first organometallic composition represented by Formula $RSnO_{(3/2-x/2)}(OH)_x$ (in the formula, $0<x<3$), in which about 0.0025 M to about 1.5 M tin is contained in the solution, R is an alkyl group or cycloalkyl group having 3 to 31 carbon atoms, and the alkyl group or cycloalkyl group is bonded to tin at a secondary or tertiary carbon atom.

An inorganic pattern forming precursor aqueous solution containing a mixture of water, a metal suboxide cation, a polyatomic inorganic anion, and a radiation-sensitive ligand containing a peroxide group.

The exposure is performed through a mask (reticle) for forming a predetermined pattern, and for example, an i-line, a KrF energy laser, an ArF energy laser, an extreme ultraviolet ray (EUV), or an electron beam (EB) is used, but an extreme ultraviolet ray (EUV) is preferably applied to the resist underlayer film-forming composition of the present invention. In the development, an alkali developer is used, and a development temperature and a development time are appropriately selected from 5° C. to 50° C. and 10 seconds to 300 seconds, respectively. As the alkali developer, for example, aqueous solutions of alkalis, for example, inorganic alkalis such as sodium hydroxide, potassium hydroxide, sodium carbonate, sodium silicate, sodium metasilicate, and ammonia water; primary amines such as ethylamine and n-propylamine; secondary amines such as diethylamine and di-n-butyl amine; tertiary amines such as triethylamine and methyldiethylamine; alcoholamines such as dimethylethanolamine and triethanolamine; quaternary ammonium salts such as tetramethylammonium hydroxide, tetraethylammonium hydroxide, and choline; and cyclic amines such as pyrrole and piperidine, may be used. Furthermore, an appropriate amount of alcohols such as isopropyl alcohol and a surfactant such as a nonionic surfactant may be added to the aqueous solution of alkalis. Of these, a preferred developer is a quaternary ammonium salt and more preferably tetramethylammonium hydroxide and choline. Furthermore, a surfactant or the like may be added to the developer. A method of performing development using an organic solvent such as butyl acetate instead of the alkali developer to develop the portion of the photoresist where the alkali dissolution rate is unimproved may also be used. Through the above steps, a substrate having the resist patterned thereon may be manufactured.

Next, the resist underlayer film is dry-etched using the formed resist pattern as a mask. At this time, the surface of the inorganic film is exposed when the inorganic film is formed on the surface of the semiconductor substrate used, and the surface of the semiconductor substrate is exposed when the inorganic film is not formed on the semiconductor substrate used. Thereafter, the semiconductor device may be manufactured through a step of processing the substrate by a method known per se (a dry etching method or the like).

EXAMPLES

Hereinafter, the present invention will be described in more detail with reference to Examples and Comparative Example, but the present invention is not limited to the following Examples.

The weight average molecular weight of the polymers described in the following Synthesis Examples 1 and 2 and Comparative Synthesis Example 1 of the present specification is the measurement results obtained by gel permeation chromatography (hereinafter, abbreviated as CRC). For the measurement, a GPC apparatus manufactured by Tosoh Corporation is used, and the measurement conditions and the like are as follows.

GPC column: Shodex KF803L, Shodex KF802, Shodex KF801 [registered trademark] (Showa Denko K.K.)
Column temperature: 40° C.
Solvent: N,N-dimethylformamide (DMF)
Flow rate: 0.6 ml/min
Standard sample: polystyrene (manufactured by Tosoh Corporation)

Synthesis Example 1

As raw materials of Polymer 1, 4.00 g of monoallyl diglycidyl isocyanurate (manufactured by Shikoku Chemicals Corporation), 3.72 g of bis(4-hydroxy-3,5-dimethylphenyl) sulfone (manufactured by Tokyo Chemical Industry Co., Ltd.), 0.70 g of 5-norbornene-2,3-dicarboxylic anhydride (manufactured by Tokyo Chemical Industry Co., Ltd.), 0.13 g of 2,6-di-tert-butyl-p-cresol (manufactured by Tokyo Chemical Industry Co., Ltd.), and 0.36 g of tetrabutylphosphonium bromide (manufactured by Tokyo Chemical Industry Co., Ltd.) were added to 26.76 g of propylene glycol monomethyl ether and dissolved therein. The reaction vessel was purged with nitrogen, and then a reaction was allowed to proceed at 105° C. for 24 hours, thereby obtaining a solution of Polymer 1. GPC analysis of Polymer 1 thus obtained showed that the weight average molecular weight was 7,600 in terms of standard polystyrene, and the polydispersity was 3.2. The structure present in Polymer 1 is shown in the following formula.

[Chem. 31]

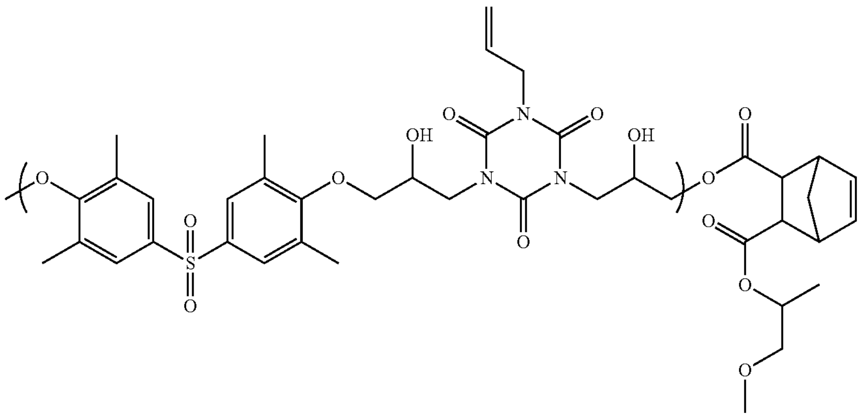

Synthesis Example 2

As raw materials of Polymer 2, 4.00 g of monoallyl diglycidyl isocyanurate (manufactured by Shikoku Chemicals Corporation), 3.72 g of bis(4-hydroxy-3,5-dimethylphenyl) sulfone (manufactured by Tokyo Chemical Industry Co., Ltd.), 0.77 g of 1-hydroxyadamantane carboxylic acid (manufactured by Tokyo Chemical Industry Co., Ltd), 0.13 g of 2,6-di-tert-butyl-p-cresol (manufactured by Tokyo Chemical Industry Co., Ltd.), and 0.36 g of tetrabutylphosphonium bromide (manufactured by Tokyo Chemical industry Co., Ltd.) were added to 26.96 g of propylene glycol monomethyl ether and dissolved therein. The reaction vessel was purged with nitrogen, and then a reaction was allowed to proceed at 105° C.' for 24 hours, thereby obtaining a solution of Polymer 2. GPC analysis of Polymer 2 thus obtained showed that the weight average molecular weight was 7,400 in terms of standard polystyrene, and the polydispersity was 3.4. The structure present in Polymer 2 is shown in the following formula.

[Chem. 32]

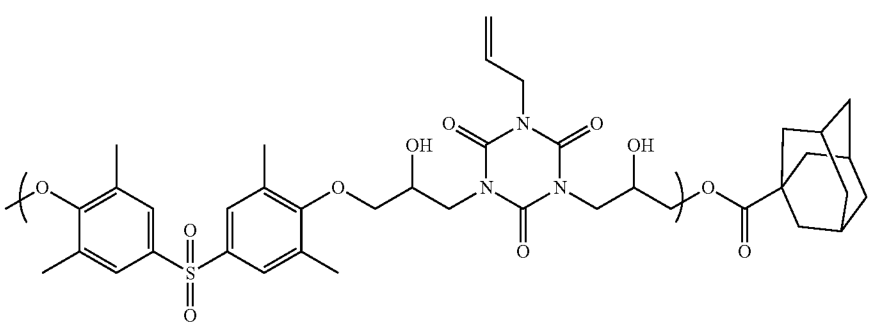

Synthesis Example 3

As raw materials of Polymer 3, 4.00 g of monoallyl diglycidyl isocyanurate (manufactured by Shikoku Chemicals Corporation), 3.72 g of bis(4-hydroxy-3,5-dimethylphenyl) sulfone (manufactured by Tokyo Chemical Industry Co., Ltd.), 0.84 g of 3-hydroxy-1-adamantane carboxylic acid (manufactured by Tokyo Chemical Industry Co., 0.13 g of 2,6-di-tert-butyl-p-cresol (manufactured by Tokyo Chemical Industry Co., Ltd.), and 0.36 g of tetrabutylphosphonium bromide (manufactured by Tokyo Chemical Industry Co., Ltd.) were added to 27.17 g of propylene glycol monomethyl ether and dissolved therein. The reaction vessel was purged with nitrogen, and then a reaction was allowed to proceed at 105° C. for 24 hours, thereby obtaining a solution of Polymer 3. GPC analysis of Polymer 3 thus obtained showed that the weight average molecular weight was 7,400 in terms of standard polystyrene, and the polydispersity was 3.2. The structure present in Polymer 3 is shown in the following formula.

[Chem. 33]

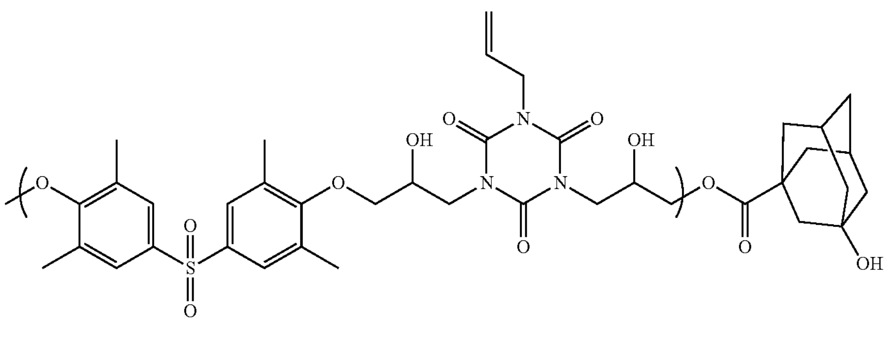

Synthesis Example 4

As raw materials of Polymer 4, 4.00 g of monoallyl diglycidyl isocyanurate (manufactured by Shikoku Chemicals Corporation), 3.72 g of bis(4-hydroxy-3,5-dimethylphenyl) sulfone (manufactured by Tokyo Chemical Industry Co., Ltd.), 0.86 g of 4-methylsulfonyl benzoic acid (manufactured by Tokyo Chemical Industry Co., Ltd.), 0.13 g of 2,6-di-tert-butyl-p-cresol (manufactured by Tokyo Chemical Industry Co., Ltd), and 0.36 g of tetrabutylphosphonium bromide (manufactured by Tokyo Chemical Industry Co., Ltd.) were added to 36.29 g of propylene glycol monomethyl ether and dissolved therein. The reaction vessel was purged with nitrogen, and then a reaction was allowed to proceed at 105° C. for 24 hours, thereby obtaining a solution of Polymer 4. GPC analysis of Polymer 4 thus obtained showed that the weight average molecular weight was 6,200 in terms of standard polystyrene, and the polydispersity was 3.9. The structure present in Polymer 4 is shown in the following formula.

[Chem. 34]

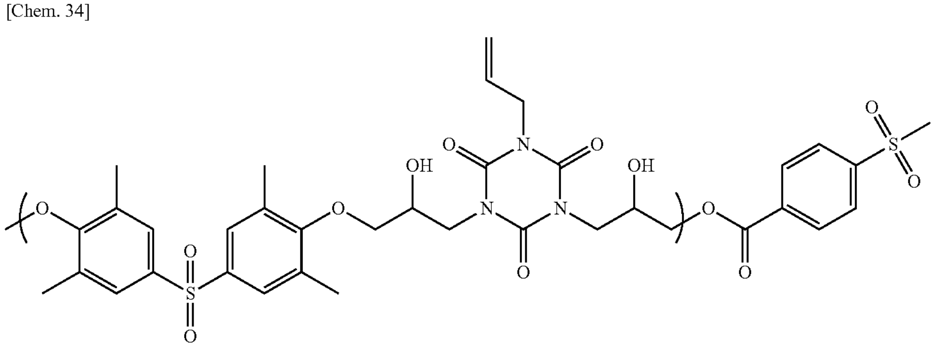

Comparative Synthesis Example 1

As raw materials of Comparative Polymer 1, 3.00 g of monoallyl diglycidyl isocyanurate (manufactured by Shikoku Chemicals Corporation), 3.94 g of bis(4-hydroxy-3,5-dimethylphenyl) sulfone (manufactured by Tokyo Chemical Industry Co., Ltd.), 0.10 g of 2,6-di-Cert-butyl-p-cresol (manufactured by Tokyo Chemical Industry Co., Ltd.), and 0.27 g of tetrabutylphosphonium bromide (manufactured by Tokyo Chemical Industry Co., Ltd.) were added to 21.93 g of propylene glycol monomethyl ether and dissolved therein. The reaction vessel was purged with nitrogen, and then a reaction was allowed to proceed at 105° C. for 24 hours, thereby obtaining a solution of Comparative Polymer 1. GPC analysis of Comparative Polymer 1 thus obtained showed that the weight average molecular weight was 6,400 in terms of standard polystyrene, and the polydispersity was 4.6. The structure present in Comparative Polymer 1 is shown in the following formula.

[Chem. 35]

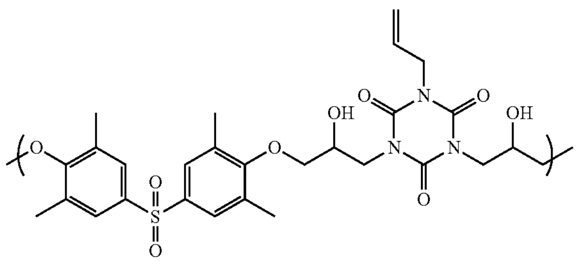

(Preparation of Resist Underlayer Film)

EXAMPLES

Each of the polymers obtained in Synthesis Examples 1 to 4 and Comparative Synthesis Example 1, a crosslinking agent, a curing catalyst (acid generator), and a solvent were mixed at ratios as shown in Tables 1 and 2. Each of the resultant mixtures was filtered through a 0.1 μm fluororesin filter, thereby preparing solutions of resist underlayer film-forming compositions, respectively.

In Tables 1 and 2, tetramethoxymethyl glycoluril (manufactured by Nihon Cytec Industries Inc.) was abbreviated as PL-LI; imidazo[4,5-d]imidazole-2,5(1H,3H)-dione, tetrahydro-1,3,4,6-tetrakis[(2-methoxy-1-methylethoxy) methyl]- was abbreviated as PGME-PL; pyridinium p-hydroxybenzenesulfonic acid was abbreviated as PyPSA; propylene glycol monomethyl ether acetate was abbreviated as PGMEA; and propylene glycol monomethyl ether was abbreviated as PGME. Each amount incorporated was shown in part(s) by mass.

TABLE 1

| | Polymer | Cross-linking agent | Curing catalyst | Solvent | |
|---|---|---|---|---|---|
| Example 1 (parts by mass) | Synthesis Example 1 0.15 | PGME-PL 0.04 | PyPSA 0.01 | PGME 70 | PGMEA 30 |
| Example 2 (parts by mass) | Synthesis Example 1 0.15 | PL-LI 0.04 | PyPSA 0.01 | PGME 70 | PGMEA 30 |
| Example 3 (parts by mass) | Synthesis Example 2 0.15 | PGME-PL 0.04 | PyPSA 0.01 | PGME 70 | PGMEA 30 |
| Example 4 (parts by mass) | Synthesis Example 2 0.15 | PL-LI 0.04 | PyPSA 0.01 | PGME 70 | PGMEA 30 |
| Example 5 (parts by mass) | Synthesis Example 3 0.15 | PGME-PL 0.04 | PyPSA 0.01 | PGME 70 | PGMEA 30 |
| Example 6 (parts by mass) | Synthesis Example 3 0.15 | PL-LI 0.04 | PyPSA 0.01 | PGME 70 | PGMEA 30 |
| Example 7 (parts by mass) | Synthesis Example 4 0.15 | PGME-PL 0.04 | PyPSA 0.01 | PGME 70 | PGMEA 30 |
| Example 8 (parts by mass) | Synthesis Example 4 0.15 | PL-LI 0.04 | PyPSA 0.01 | PGME 70 | PGMEA 30 |

TABLE 2

| | Polymer | Crosslinking agent | Curing catalyst | Solvent | |
|---|---|---|---|---|---|
| Comparative Example 1 (parts by mass) | Comparative Synthesis Example 1 0.15 | PGME-PL 0.04 | PyPSA 0.01 | PGME 70 | PGMEA 30 |

(Elution Test in Photoresist Solvent)

Each of the resist underlayer film-forming compositions of Examples 1 to 8 and Comparative Example 1 was applied onto a silicon wafer using a spinner. The silicon wafer was baked on a hot plate at 205° C. for 60 seconds to obtain a film having a thickness of 5 nm. These resist underlayer films were immersed in a mixed solution of propylene glycol monomethyl ether/propylene glycol monomethyl ether=70/30, which is a solvent used for the photoresist, and a case where the film thickness change was 1 Å or less was evaluated as good, and a case where the film thickness change was 1 Å or more was evaluated as poor. The results thereof are shown in Table 3.

(Film Formability Test)

Each of the resist underlayer film-forming compositions of Examples 1 to 8 and Comparative Example 1 was applied onto a silicon wafer using a spinner. The silicon wafer was baked on a hot plate at 205° C. for 60 seconds to obtain a film having a thickness of 5 nm and 3.5 nm. The surface roughness (Sa) of each of the resist underlayer films was measured using an atomic force microscope (AFM), and a case where the surface roughness was better than that of Comparative Example 1 was evaluated as good, and a case where the surface roughness was inferior to that of Comparative Example 1 was evaluated as poor. The results thereof are shown in Table 3.

TABLE 3

| | | Applicability | |
|---|---|---|---|
| | Elution test | 5 nm | 3.5 nm |
| Example 1 | Good | Good | Good |
| Example 2 | Good | Good | Good |
| Example 3 | Good | Good | Good |
| Example 4 | Good | Good | Good |
| Example 5 | Good | Good | Good |
| Example 6 | Good | Good | Good |
| Example 7 | Good | Good | Good |
| Example 8 | Good | Good | Good |
| Comparative Example 1 | Good | — | — |

(Evaluation of Resist Patterning)

[Test for Forming Resist Pattern by Electron Beam Drawing Apparatus]

Each of the resist underlayer film-forming compositions was applied onto a silicon wafer using a spinner. The silicon wafer was baked on a hot plate at 205° C. for 60 seconds to obtain a resist underlayer film having a thickness of 5 nm. A positive resist solution for EUV was spin-coated on the resist underlayer film, and heating was performed at 110° C. for 60 seconds, thereby forming an HIV resist film. The resist film was exposed under predetermined conditions using an electron beam drawing apparatus (ELS-G130). After the exposure, the film was baked (PEB) at 90° C. for 60 seconds, the baked film was cooled on a cooling plate to room temperature, and the cooled film was subjected to paddle development for 60 seconds using a 2.38% tetramethylammonium hydroxide aqueous solution (manufactured by TOKYO OHKA KOGYO CO., LTD., trade name: NMD-3) as a photoresist developer. A resist pattern having a line size of 15 nm to 27 nm was formed. A scanning electron microscope (manufactured by Hitachi High-Technologies Corporation, CG4100) was used for measuring the length of the resist pattern.

The photoresist pattern thus obtained was subjected to the determination whether or not a 22 nm line-and-space (L/S) was formed. The formation of the 22 nm L/S pattern was confirmed in all cases of Example 1, Example 3, and Comparative Example 1. In addition, the charge amount for forming 22 nm line/44 nm pitch (line-and-space (L/S=1/1)) is defined as the optimum irradiation energy. The smaller the value of the irradiation energy (μC/cm$^2$) at this time, the higher the sensitivity of the resist. The results of Examples 1 and 3 showed a lower value than the result of Comparative Example 1, i.e., they showed improvement in the sensitivity. In addition, the pattern was observed from the above to confirm the minimum CD size at which no collapse was observed within the shot of the resist pattern. The smaller this value, the better the adhesion to the resist. The results of Examples 1 and 3 showed a smaller value of the minimum CD size than the result of Comparative Example 1, i.e., they, showed desirable adhesion to the resist.

TABLE 4

| | Irradiation energy (μC/cm$^2$) | Minimum CD size (nm) |
|---|---|---|
| Example 1 | 308 | 20 |
| Example 3 | 303 | 19 |
| Comparative Example 1 | 320 | 21 |

INDUSTRIAL APPLICABILITY

The resist underlayer film-forming composition according to the present invention can provide a composition for forming a resist underlayer film that can form a desired resist pattern, a method for manufacturing a substrate with a resist pattern using the resist underlayer film-forming, composition, and a method for manufacturing a semiconductor device.

The invention claimed is:

1. A resist underlayer film-forming composition comprising:

a polymer having a terminal blocked with a compound (A), wherein the compound (A) contains an aliphatic ring, which is a bicyclo ring or a tricyclo ring, which may be substituted with a substituent; and an organic solvent, wherein the polymer is a polymer having a repeating unit structure derived from a compound (B) and a compound (C) capable of reacting with the compound (B), wherein the compound (B) is represented by the following Formula (11):

[Chem. 36]

Formula (11)

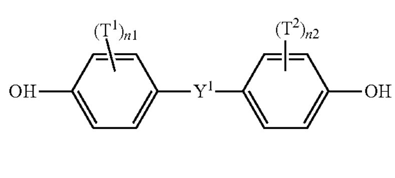

wherein in Formula (11), $Y^1$ is a sulfonyl group, each of $T^1$ and $T^2$ represents an alkyl group having 1 to 10 carbon atoms, and n1 and n2 each independently represent an integer of 0 to 4, and wherein the compound (C) is selected from the group consisting of:

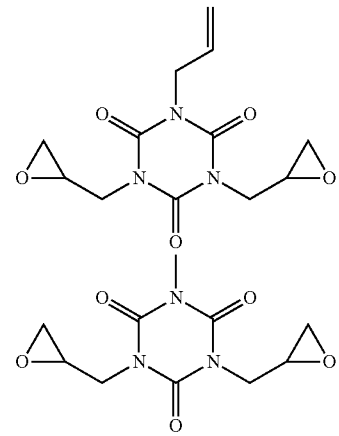

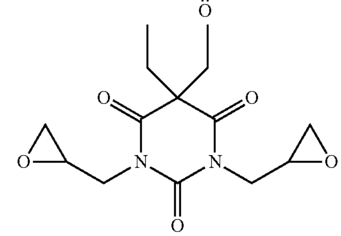

and

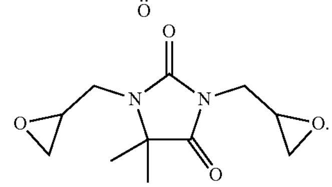

2. The resist underlayer film-forming composition according to claim 1, wherein the aliphatic ring is substituted with a substituent, wherein the substituent is selected from a hydroxy group, a linear or branched alkyl group having 1 to 10 carbon atoms, an alkoxy group having 1 to 20 carbon atoms, an acyloxy group having 1 to 10 carbon atoms which may be interrupted by an oxygen atom, and a carboxy group.

3. The resist underlayer film-forming composition according to claim 1, further comprising an acid generator.

4. The resist underlayer film-forming composition according to claim 1, further comprising a crosslinking agent.

5. A resist underlayer film, which is a baked product of a coating film of the resist underlayer film-forming composition according to claim 1.

6. A method for manufacturing a patterned substrate, comprising the steps of:

applying the resist underlayer film-forming composition according to claim 1 onto a semiconductor substrate and baking the resist underlayer film-forming composition to form a resist underlayer film;

applying a resist onto the resist underlayer film and baking the resist to form a resist film;

exposing the resist underlayer film and the semiconductor substrate coated with the resist; and developing the exposed resist film to perform patterning.

7. A method for manufacturing a semiconductor device, comprising the steps of:

forming a resist underlayer film of the resist underlayer film-forming composition according to claim 1 on a semiconductor substrate;

forming a resist film on the resist underlayer film;

forming a resist pattern by irradiating the resist film with a light or electron beam and then developing the irradiated resist film;

forming a patterned resist underlayer film by etching the resist underlayer film through the formed resist pattern; and processing the semiconductor substrate by the patterned resist underlayer film.

* * * * *